United States Patent
Nakashiba et al.

(10) Patent No.: US 12,374,647 B2
(45) Date of Patent: Jul. 29, 2025

(54) SEMICONDUCTOR DEVICE INCLUDING CHIP-TO-CHIP BONDING

(71) Applicant: RENESAS ELECTRONICS CORPORATION, Tokyo (JP)

(72) Inventors: Yasutaka Nakashiba, Tokyo (JP); Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 462 days.

(21) Appl. No.: 17/742,975

(22) Filed: May 12, 2022

(65) Prior Publication Data

US 2023/0369278 A1  Nov. 16, 2023

(51) Int. Cl.
*H01L 25/04* (2023.01)
*H01L 23/00* (2006.01)
(Continued)

(52) U.S. Cl.
CPC .......... *H01L 24/33* (2013.01); *H01L 23/3157* (2013.01); *H01L 24/02* (2013.01);
(Continued)

(58) Field of Classification Search
CPC ......... H01L 24/33; H01L 24/02; H01L 24/05; H01L 24/06; H01L 24/73; H01L 24/45; H01L 24/46; H01L 24/48; H01L 24/49; H01L 24/29; H01L 24/32; H01L 24/83; H01L 24/85; H01L 23/3157; H01L 23/3121; H01L 23/3171; H01L 23/4952; H01L 23/49524; H01L 23/49562; H01L 23/49575; H01L 23/3107; H01L 23/49816; H01L 23/49838; H01L 25/16; H01L 25/0657; H01L 25/043; H01L 25/0756; H01L 25/074; H01L 29/7813; H01L 29/7811; H01L 29/7815; H01L 29/0615; H01L 29/41725; H01L 2224/0221; H01L 2224/02215; H01L 2224/05083; H01L 2224/05124; H01L 2224/05155; H01L 2224/05164; H01L 2224/05644; H01L 2224/0603; H01L 2224/06051; H01L 2224/0615; H01L 2224/29139;
(Continued)

(56) References Cited

U.S. PATENT DOCUMENTS 9,147,647 B2    9/2015  Kaneda
2003/0141582 A1* 7/2003  Yang ........................ H01L 24/73
                                                                    257/E23.079
(Continued)

FOREIGN PATENT DOCUMENTS

JP    2014-093431 A    5/2014

*Primary Examiner* — Ida M Soward
(74) *Attorney, Agent, or Firm* — Rimon P.C.

(57) ABSTRACT

A semiconductor device includes: a first semiconductor chip mounted on a chip mounting portion via a first bonding material; and a second semiconductor chip mounted on the first semiconductor chip. Here, the first semiconductor chip has: a protective film located in an uppermost layer; and a first pad electrode exposed from the protective film at an inside of a first opening portion of the protective film. Also, the second semiconductor chip is mounted on a conductive material, which is arranged on the first pad electrode of the first semiconductor chip, via a second bonding material of an insulative property.

16 Claims, 33 Drawing Sheets

(51) Int. Cl.
*H01L 23/31* (2006.01)
*H01L 25/07* (2006.01)
*H01L 25/16* (2023.01)
*H01L 25/075* (2006.01)
*H10D 30/66* (2025.01)

(52) U.S. Cl.
CPC .............. *H01L 24/05* (2013.01); *H01L 24/06*
(2013.01); *H01L 24/73* (2013.01); *H01L 25/16*
(2013.01); *H01L 23/3121* (2013.01); *H01L 24/45* (2013.01); *H01L 24/46* (2013.01); *H01L 24/48* (2013.01); *H01L 24/49* (2013.01); *H01L 25/043* (2013.01); *H01L 25/074* (2013.01); *H01L 25/0756* (2013.01); *H01L 2224/0221* (2013.01); *H01L 2224/02215* (2013.01); *H01L 2224/05083* (2013.01); *H01L 2224/05124* (2013.01); *H01L 2224/05155* (2013.01); *H01L 2224/05164* (2013.01); *H01L 2224/05644* (2013.01); *H01L 2224/0603* (2013.01); *H01L 2224/06051* (2013.01); *H01L 2224/0615* (2013.01); *H01L 2224/29139* (2013.01); *H01L 2224/2919* (2013.01); *H01L 2224/32145* (2013.01); *H01L 2224/32245* (2013.01); *H01L 2224/33181* (2013.01); *H01L 2224/33505* (2013.01); *H01L 2224/45124* (2013.01); *H01L 2224/45144* (2013.01); *H01L 2224/46* (2013.01); *H01L 2224/48145* (2013.01); *H01L 2224/48245* (2013.01); *H01L 2224/49112* (2013.01); *H01L 2224/49171* (2013.01); *H01L 2224/49175* (2013.01); *H01L 2224/49177* (2013.01); *H01L 2224/73215* (2013.01); *H01L 2224/73265* (2013.01); *H01L 2924/13091* (2013.01); *H10D 30/668* (2025.01)

(58) Field of Classification Search
CPC ... H01L 2224/2919; H01L 2224/32145; H01L 2224/32245; H01L 2224/33181; H01L 2224/33505; H01L 2224/45124; H01L 2224/45144; H01L 2224/46; H01L 2224/48145; H01L 2224/48245; H01L 2224/49112; H01L 2224/49171; H01L 2224/49175; H01L 2224/49177; H01L 2224/73215; H01L 2224/73265; H01L 2924/13091
See application file for complete search history.

(56) References Cited

U.S. PATENT DOCUMENTS

| | | | |
|---|---|---|---|
| 2004/0150084 A1* | 8/2004 | Nishida | H01L 24/49 257/E25.013 |
| 2006/0091560 A1* | 5/2006 | Kang | H01L 25/0652 257/E23.125 |
| 2013/0020720 A1* | 1/2013 | Kim | H01L 25/0657 257/774 |
| 2014/0239508 A1* | 8/2014 | Ichikawa | H01L 24/06 257/774 |
| 2014/0332983 A1* | 11/2014 | Ho | H01L 24/43 438/126 |
| 2014/0339290 A1* | 11/2014 | Han | H01L 24/49 228/180.5 |
| 2015/0102506 A1* | 4/2015 | Song | H01L 24/05 257/777 |
| 2023/0054984 A1* | 2/2023 | Kim | H01L 25/50 |
| 2023/0098993 A1* | 3/2023 | Oh | H01L 24/48 257/686 |

* cited by examiner

SEMICONDUCTOR DEVICE INCLUDING CHIP-TO-CHIP BONDING

BACKGROUND

The present invention relates to a semiconductor device, and, for example, the present invention can be suitably applied to a semiconductor device including two stacked semiconductor chips therein.

Here, there are disclosed techniques listed below.
[Patent Document 1] Japanese Unexamined Patent Application Publication No. 2014-93431

A semiconductor package is manufactured by mounting a semiconductor chip on a die pad, electrically connecting a pad of the semiconductor chip with a lead via a wire, and sealing them with resin.

Patent Document 1 discloses a semiconductor package including a semiconductor chip mounted on a die pad, and another semiconductor chip mounted on the semiconductor chip.

SUMMARY

In semiconductor device having two semiconductor chips stacked, it is desired to improve the performance.

Other objects and novel features will become apparent from the description of this specification and the accompanying drawings.

A semiconductor device according to one embodiment, includes: a first semiconductor chip mounted on a chip mounting portion via a first bonding material; and a second semiconductor chip mounted on the first semiconductor chip. Here, the first semiconductor chip has: a protective film located in an uppermost layer; and a first pad electrode exposed from the protective film at an inside of a first opening portion of the protective film. Also, the second semiconductor chip is mounted on a conductive material, which is arranged on the first pad electrode of the first semiconductor chip, via a second bonding material of an insulative property.

According to an embodiment, the performance of the semiconductor device can be improved.

DETAILED DESCRIPTION

Figure 1:
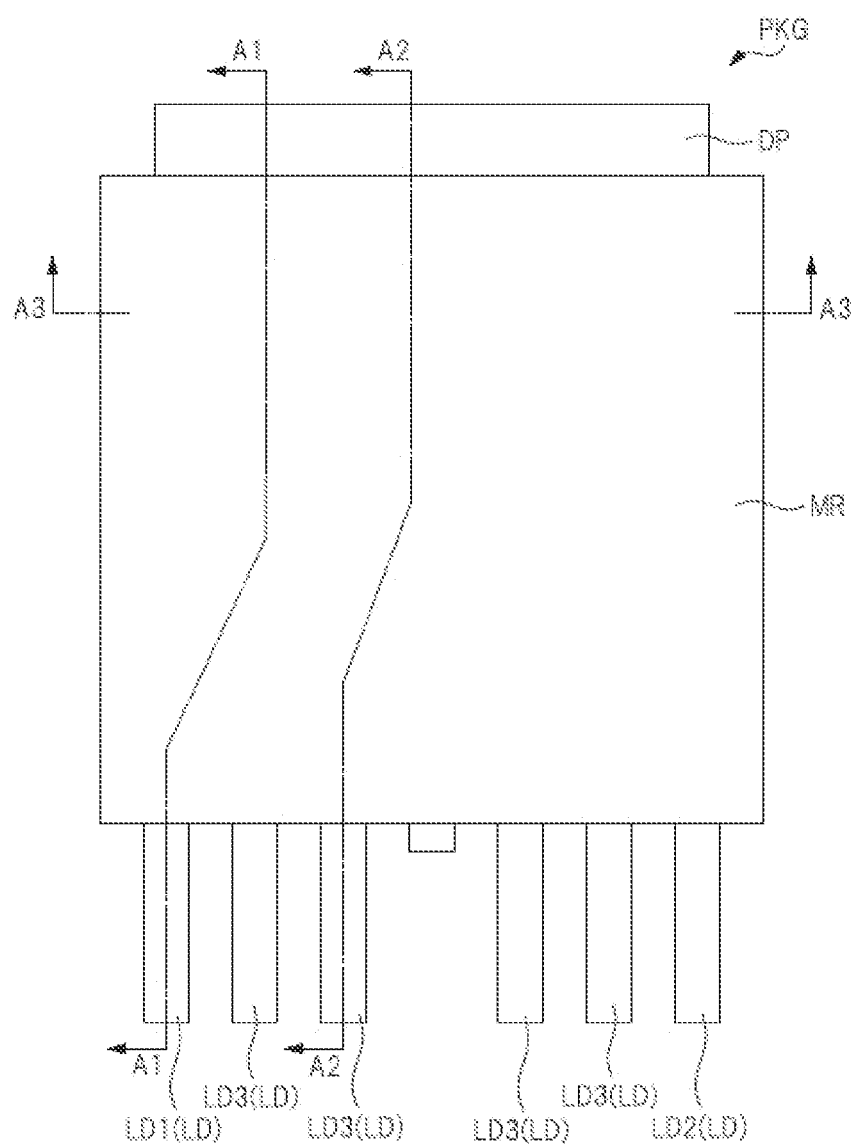
FIG. 1 is an upper surface view of a semiconductor device according to an embodiment 1.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Detailed explanation will be described below based on figures. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

In the present application, the field-effect transistor is referred to as a MOSFET (Metal Oxide Semiconductor Field Effect Transistor), but includes not only the case where an oxide film is used as a gate insulating film but also the case where an insulating film other than an oxide film is used as a gate insulating film.

Embodiment 1

Figure 2:
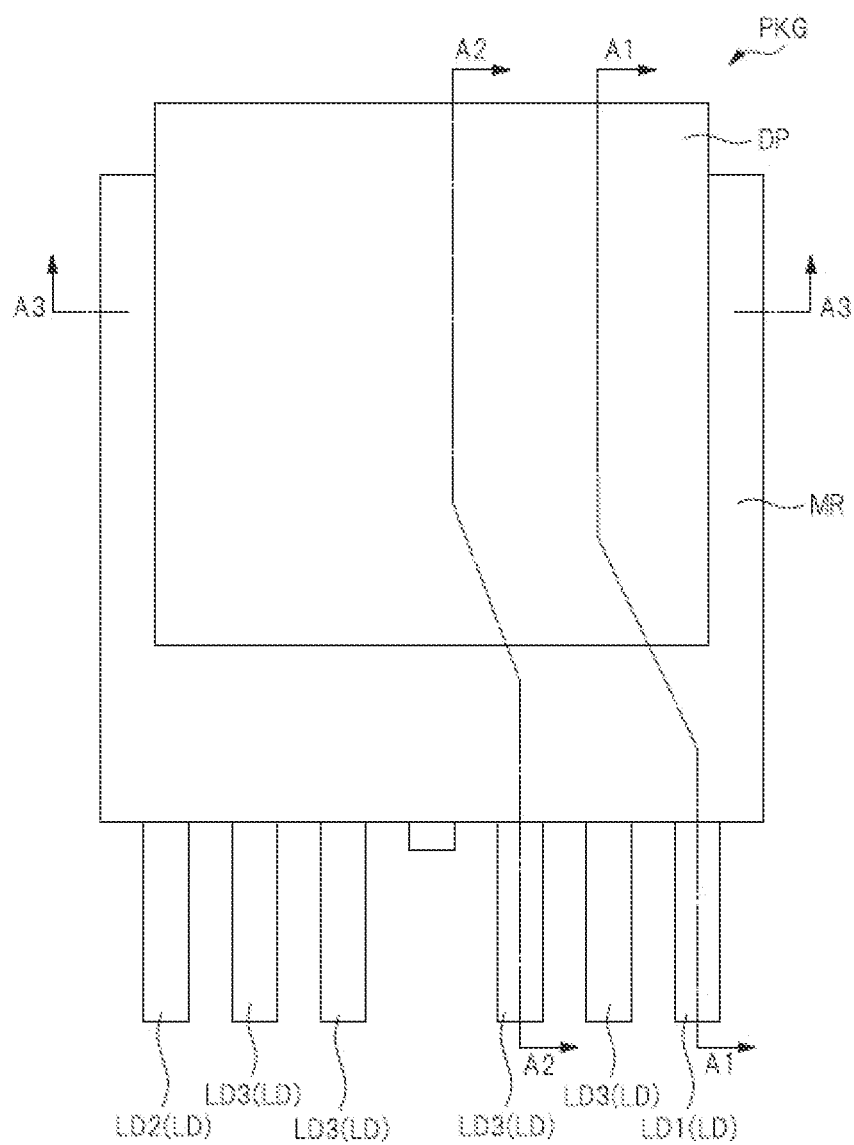
FIG. 2 is a lower surface view of the semiconductor device according to the embodiment 1.
Figure 3:
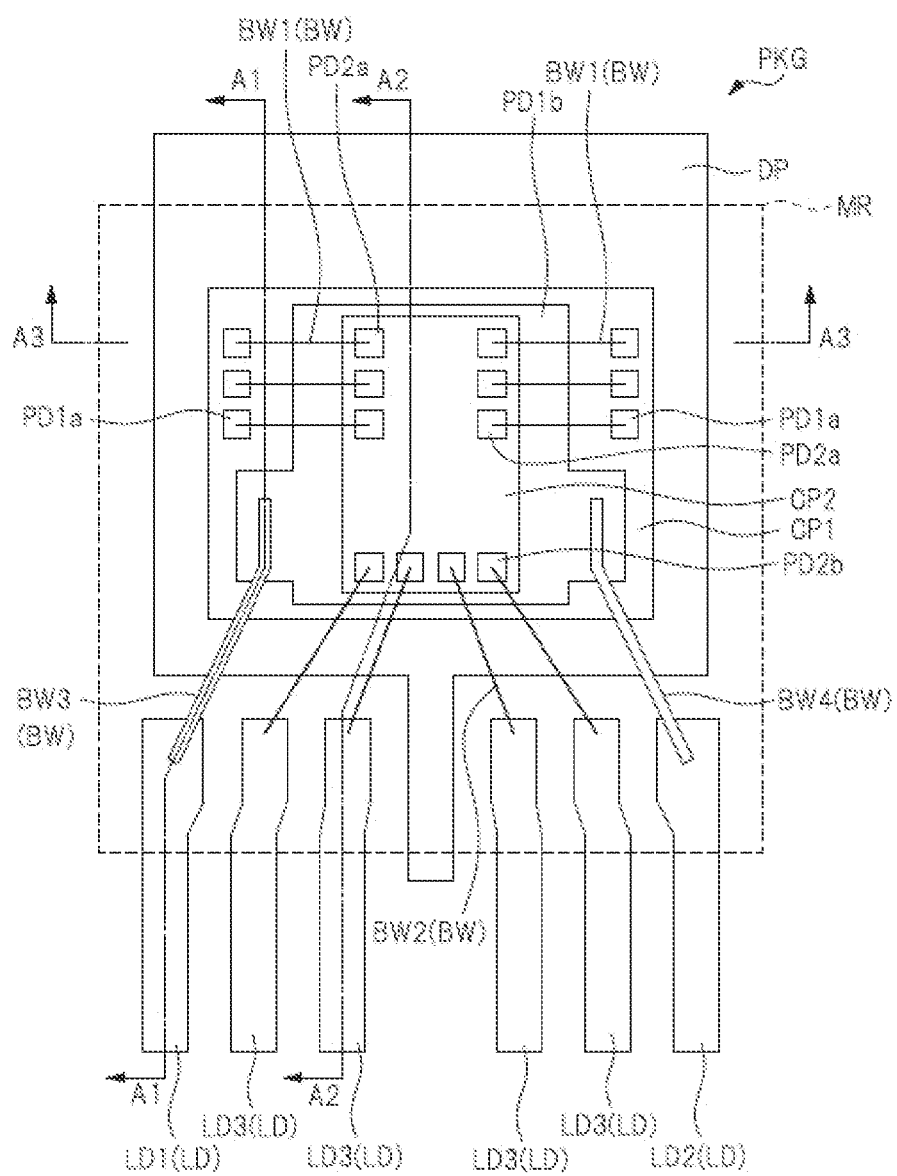
FIG. 3 is a perspective plan view of the semiconductor device according to the embodiment 1.
Figure 4:
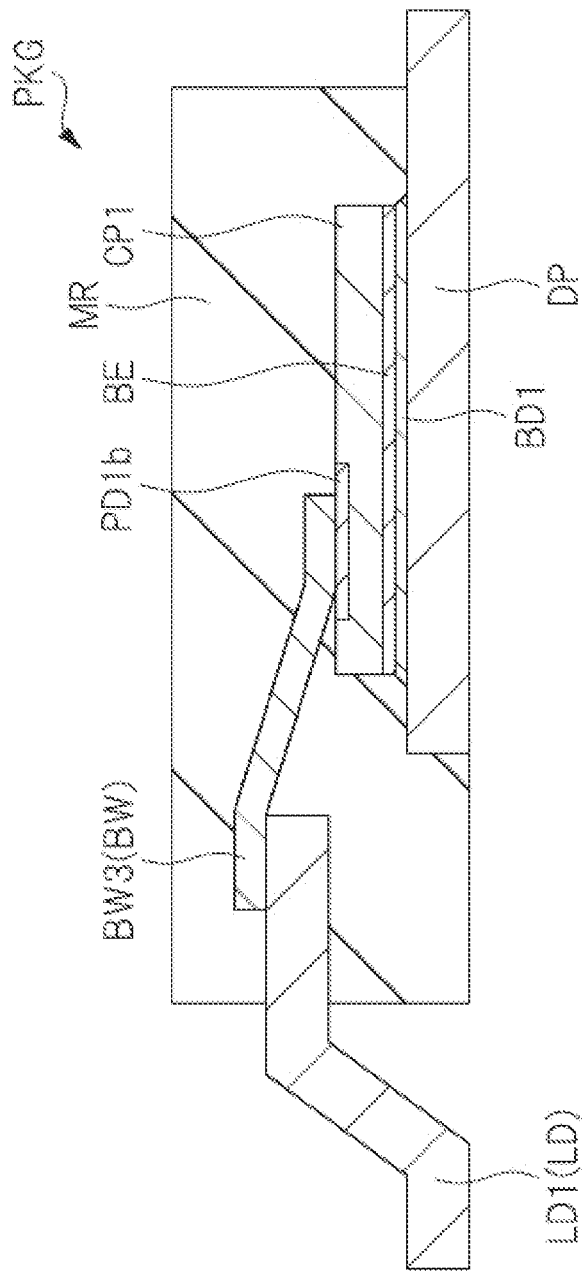
FIG. 4 is a cross-sectional view of the semiconductor device according to the embodiment 1.
Figure 5:
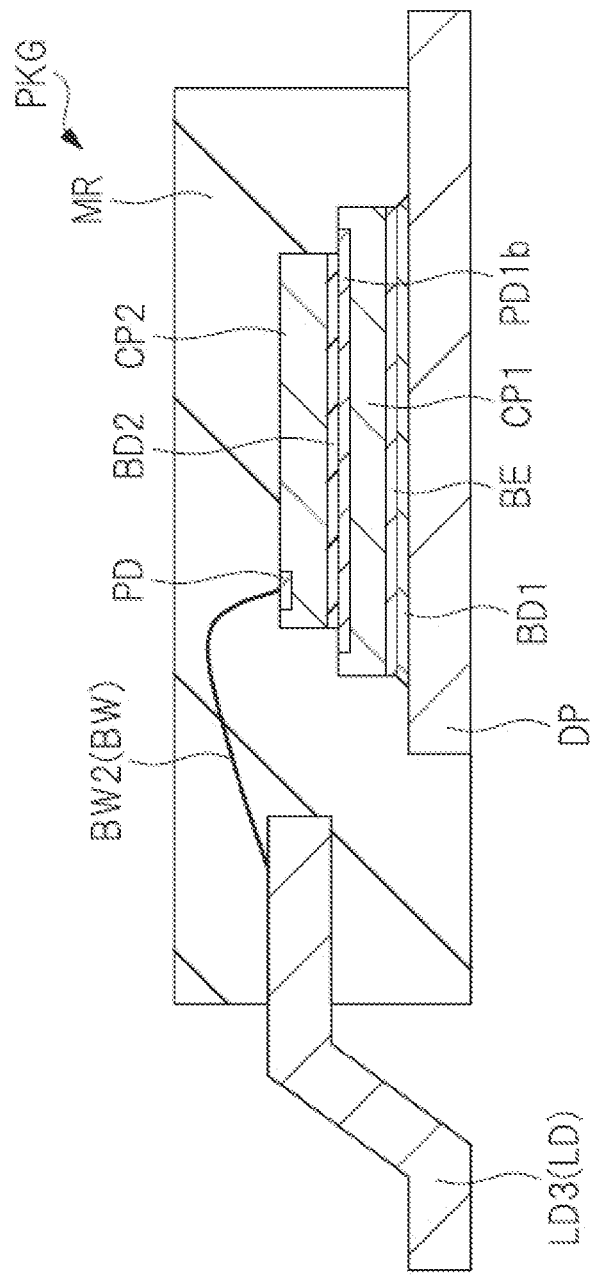
FIG. 5 is a cross-sectional view of the semiconductor device according to the embodiment 1.
Figure 6:
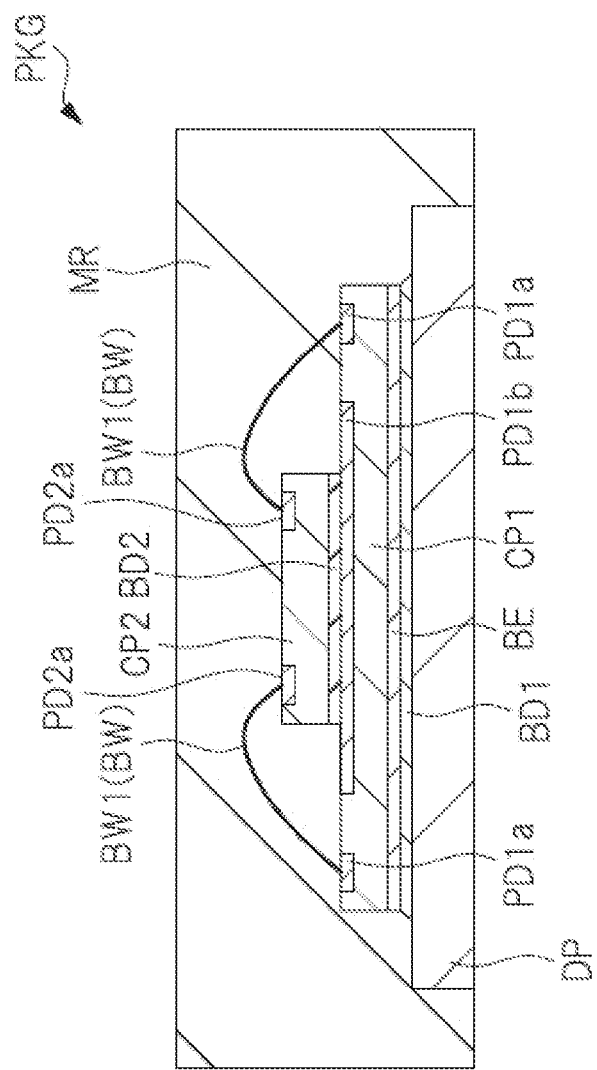
FIG. 6 is a cross-sectional view of the semiconductor device according to the embodiment 1.
Figure 7:
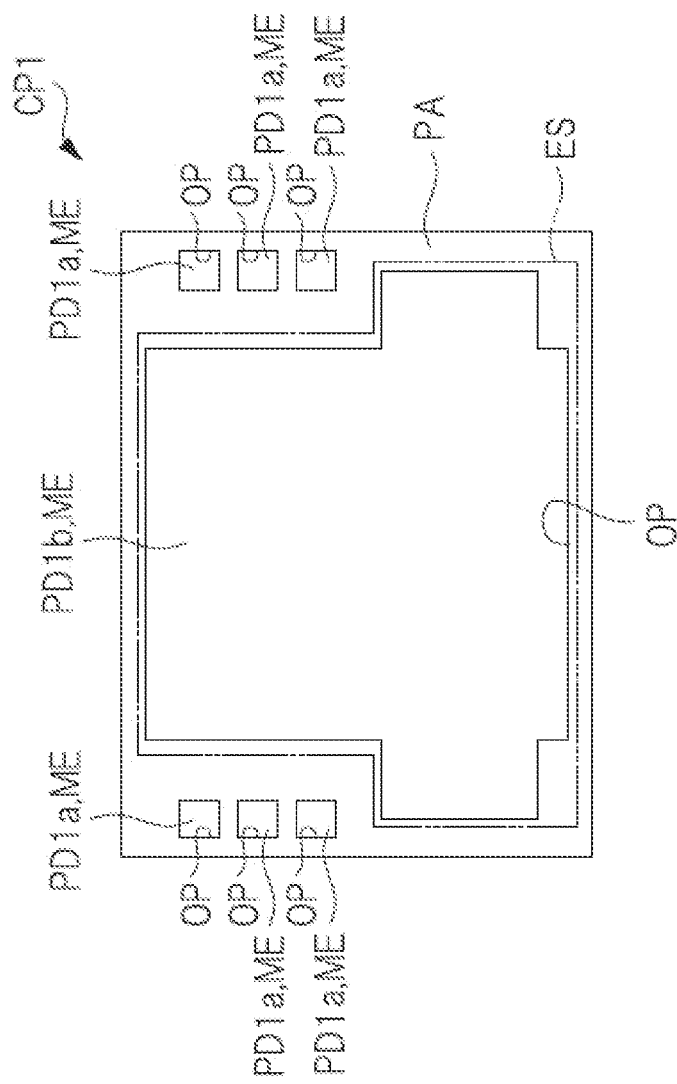
FIG. 7 is an upper surface view of a semiconductor chip used in the semiconductor device according to the embodiment 1.
Figure 8:
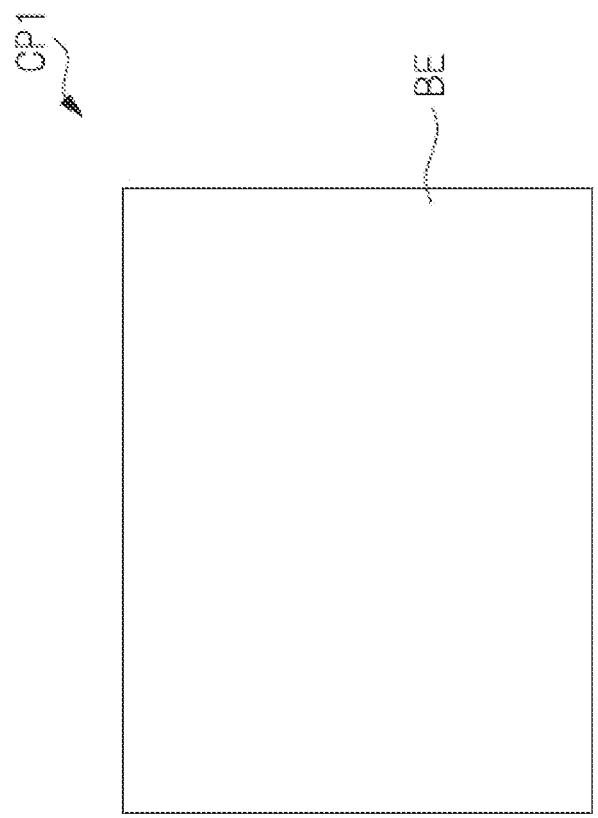
FIG. 8 is a lower surface view of the semiconductor chip used in the semiconductor device according to the embodiment 1.
Figure 9:
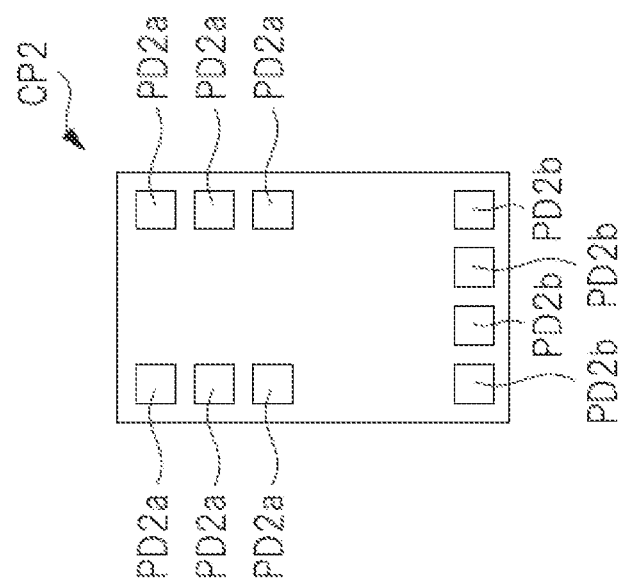
FIG. 9 is an upper surface view of a semiconductor chip used in the semiconductor device according to the embodiment 1.

<Structure of Semiconductor Device>
The structure of a semiconductor device of the present embodiment is described by referring to FIGS. 1 to 9. FIG. 1 is an upper surface view of a semiconductor device PKG according to the present embodiment, and FIG. 2 is a lower surface view of the semiconductor device PKG according to the present embodiment. FIG. 3 is a perspective plan view of the semiconductor device PKG according to the present embodiment, and showing the perspective plan view of the semiconductor device PKG when seen from the upper surface of the semiconductor device PKG through the sealing portion MR. FIGS. 4 to 6 are a cross-sectional view of the semiconductor device PKG of the present embodiment. The cross-sectional view at the position of A1-A1 line in each of FIGS. 1 to 3 corresponds to FIG. 4, the cross-sectional view at the position of A2-A2 line in each of FIGS. 1 to 3 corresponds to FIG. 5, and the cross-sectional view at the position of A3-A3 line in each of FIGS. 1 to 3 corresponds to FIG. 6. FIG. 7 is an upper surface view of a semiconductor chip CP1 used in the semiconductor device PKG according to the present embodiment. FIG. 8 is a lower surface view (back surface) of the semiconductor chip CP1 used in the semiconductor device PKG according to the present embodiment. Also, FIG. 9 is an upper surface view of a semiconductor chip CP2 used in the semiconductor device PKG according to the present embodiment.

The semiconductor device PKG shown in FIGS. 1-6 is a semiconductor package including a semiconductor chip CP1 containing a power MOSFET for switching and a semiconductor chip CP2 for controlling the semiconductor chip CP1.

The semiconductor device PKG includes a die pad (chip mounting portion) DP, a semiconductor chip CP1 mounted on upper surface (main surface) of the die pad DP, a semiconductor chip CP2 mounted on the semiconductor chip CP1, a plurality of leads LD, a plurality of bonding wires (hereinafter, simply referred to as wire) BW, and a sealing portion for sealing them (sealing resin portion, sealing body) MR, and a.

The sealing portion MR is made of, for example, a resin material such as a thermosetting resin material, and may also include a filler and the like. For example, a sealing portion MR can be formed using an epoxy resin or the like containing a filler.

The die pad DP and the plurality of leads LD are composed of a conductor, preferably made of a metal material such as copper (Cu) or a copper alloy. Part of each of the plurality of leads LD is sealed in the sealing portion MR, and the other part protrudes from the side surface of the sealing portion MR to the outside of the sealing portion MR. Hereinafter, a portion of the lead LD located inside the sealing portion MR is referred to as an inner lead portion, and a portion of the lead LD located outside the sealing portion MR is referred to as an outer lead portion.

The semiconductor device PKG of the present embodiment has a configuration in which a part of each lead LD (outer lead portion) protrudes from the side surface of the sealing portion MR, and will be described below based on this structure; however, the present invention is not limited to this structure, and for example, a structure in which each lead LD hardly protrudes from the side surface of the sealing portion MR and a part of each lead LD is exposed at the lower surface of the sealing portion MR may be adopted.

On the front side of the semiconductor chip CP1, a plurality of pad electrodes (hereinafter, simply referred to as pads) PD1*a*,PD1*b* is formed, on the back side of the semiconductor chip CP1, the back electrode BE is formed. Semiconductor chip CP1, the front side facing upward, the back electrode BE facing upper surface of the die pad DP, is mounted via a conductive bonding material BD1 on upper surface of the die pad DP It is bonded. That is, the back electrode BE of the semiconductor chip CP1 is bonded via a conductive bonding material BD1 to upper surface of the die pad DP. Therefore, the back electrode BE of the semiconductor chip CP1, via the conductive bonding material BD1, is electrically connected to the die pad DP.

The semiconductor chip CP2 is mounted on the semiconductor chip CP1 (specifically, the plating layer ME, which is to be described later, on the pad PD1 of the semiconductor chip CP1) via a bonding material BD2 of an insulative property and bonded to the semiconductor chip CP1 such that the upper surface of the semiconductor chip CP2 faces above, and such that the back surface of the second semiconductor chip CP2 faces the upper surface of the semiconductor chip CP1. The bonding material BD2 is made of, for example, a DAF (Die Attach Film) material. On the front side of the semiconductor chip CP2, a plurality of pads PD2a, PD2b are formed. The back electrode is not formed on the back surface of the semiconductor chip CP2.

The plurality of leads LDs included in semiconductor device PKG include a read LD1, LD2, LD3. The plurality of wires BW included in semiconductor device PKG include a wire BW1, BW2, BW3, BW4. The diameter of each wire BW3, BW4 is larger than the diameter of each wire BW1, BW2. That is, the wire BW3, BW4 is thicker than the wire BW1, BW2. Wire BW1, BW2, BW3, BW4 is made of metal, respectively, for example, the wire BW1, BW2 is made of gold (Au), the wire BW3, BW4 is made of aluminum (Al) or an aluminum alloy.

A plurality of pads PD1a of the semiconductor chip CP1 and a plurality of pads PD2a of the semiconductor chip CP2 are electrically connected to each other via a plurality of wires BW1, respectively.

A pad PD2b of the semiconductor chip CP2 and a plurality of leads LD1 are electrically connected to each other via a plurality of wires BW2, respectively. That is, of both ends of each wire BW2, one end portion is connected to each pad PD2b of the semiconductor chip CP2, the other end portion is connected to each lead LD1 (specifically, inner lead portion of each lead LD1).

The pad PD1b of the semiconductor chip CP1 and the lead LD2 is electrically connected to each other via a wire BW3, and the pad PD1b of the semiconductor chip CP1 and the lead LD3 is electrically connected to each other via a wire BW4.

The planar shape of the sealing portion MR is substantially rectangular and has four sides, and in the case of FIGS. 1 to 3, a plurality of leads LD (LD1, LD2, LD3) are arranged on one side of the sealing portion MR. The die pad DP and the plurality of leads LD are separated from each other, and a part of the sealing portion MR is interposed therebetween.

The semiconductor chip CP1, CP2 and the plurality of wires BW (BW1, BW2, BW3, BW4) are sealed in the sealing portion MR and are not exposed from the sealing portion MR. On the other hand, the die pad DP is sealed in the sealing portion MR except for the lower surface, but the lower surface of the die pad DP is exposed from the lower surface of the sealing portion MR.

Each outer lead portion of the plurality of leads LD protrudes from the side surface of the sealing portion MR to the outside of the sealing portion MR. Outer lead portion of each lead LD, the lower surface near the end of the outer lead portion is bent so as to be positioned substantially on the same plane as the lower surface of the sealing portion MR. The outer lead section of the lead LD functions as an external terminal section (external terminal) for connecting semiconductor device PKG. The lower surface of the die pad DP exposed at the lower surface of the sealing portion MR can also function as an external terminal of semiconductor device PKG.

<Structure of Semiconductor Chip CP1>

Figure 10:
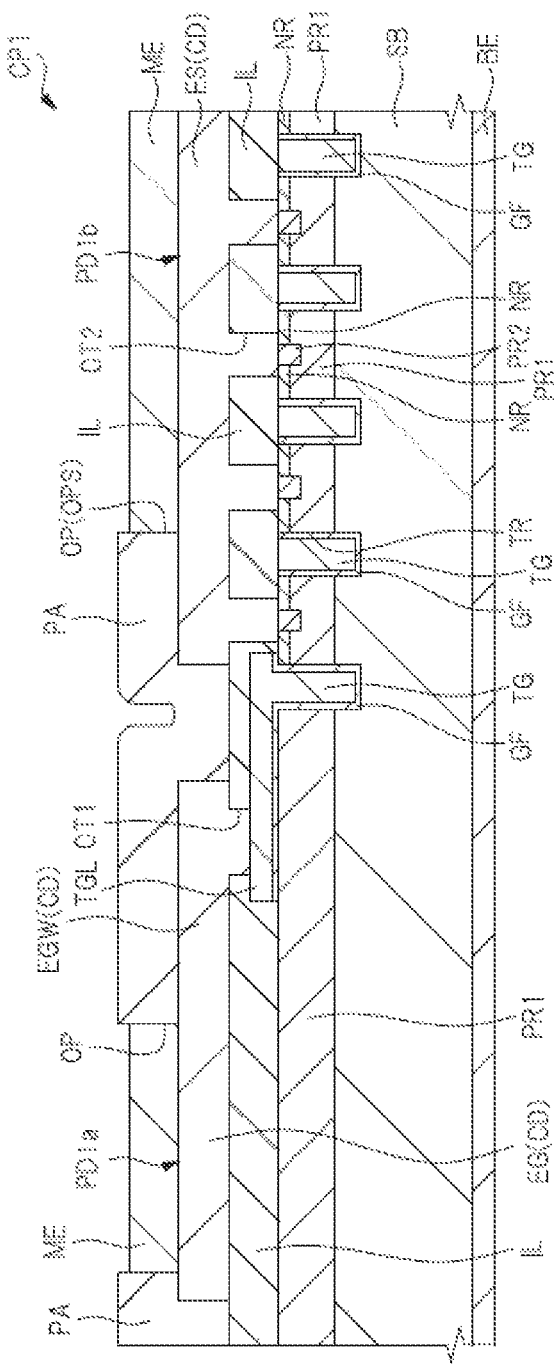
FIG. 10 is a cross-sectional view of the semiconductor chip used in the semiconductor device of according to the embodiment 1.

Next, by referring to FIG. 10, a description will be given of the structure of the semiconductor chip CP1. FIG. 10 is a cross-sectional view of the semiconductor chip CP1. In FIG. 7, the source electrode ES shown in FIG. 10 is indicated by a two-dot chain line. The outer periphery of the source electrode ES indicated by a two-dot chain line is covered with a protective film PA.

The semiconductor chip CP1 is a semiconductor chip in which a power MOSFET is formed. For details, the power MOSFET is formed in a semiconductor substrate SB composing the semiconductor chip CP1. A control circuit for controlling the semiconductor chip CP1 (the power MOSFET in the semiconductor chip CP1) is formed in the semiconductor chip CP2.

As shown in FIG. 10, the semiconductor substrate SB is made of n-type monocrystalline silicon or the like into which, for example, an n-type impurity such as arsenic (As) is introduced.

So-called epitaxial wafer can also be used as the semiconductor substrate SB. When the epitaxial wafer is used as the semiconductor substrate SB, the semiconductor substrate SB is comprised of a substrate main body (semiconductor substrate) made of $n^+$-type monocrystalline silicon or the like into which an n-type impurity such as arsenic (As) is introduced, and an epitaxial semiconductor layer made of, for example, $n^-$-type monocrystalline silicon formed on the main surface of the substrate main body.

As required, for example, a field insulating film made of a silicon oxide film (not shown here) is formed on the main surface of the semiconductor substrate SB. The field insulating film can function as an element isolation region for defining an active region.

The semiconductor substrate SB is formed with a plurality (a number) of unit transistor cells composing the power MOSFET, and the power MOSFET is formed by connecting the plurality of unit transistor cells in parallel. Each unit transistor cell has the same structure as one another. Each unit transistor cell is formed of an n-channel type MOSFET of, for example, a trench gate structure.

The semiconductor substrate SB has a function as drain region of the above-described unit transistor cell. The back electrode BE for drain is formed on the back surface of the semiconductor substrate SB (i.e., the back surface of the semiconductor chip CP1). Therefore, the back electrode BE can function as a drain electrode electrically connected to the drain of the power MOSFET. The back electrode BE is formed on the entire back surface of semiconductor substrate SB, namely, the entire back surface of the semiconductor chip CP1.

Further, the p-type semiconductor region (p-type body region) PR1 formed in semiconductor substrate SB has a function as a channel-forming region of the unit transistor cell. $n^+$ semiconductor region NR formed on the p-type semiconductor region PR1 functions as a source region of the unit transistor cell. Therefore, $n^+$-type solid-state area NR is a solid-state area for the source.

Further, the semiconductor substrate SB, the groove TR extending in the thickness direction of semiconductor substrate SB from its main surface is formed. The trench TR is formed so as to penetrate $n^+$-type semiconductor region NR and the p type semiconductor region PR1 from upper surface of $n^+$-type semiconductor region NR and terminate in semiconductor substrate SB. In other words, the p-type semiconductor region PR1 is formed between the adjacent trenches TR, and $n^+$ semiconductor region NR for sources is formed above the p-type semiconductor region PR1 and at a position adjacent to the trenches TR.

The bottom and side surfaces of the groove TR, the gate insulating film GF made of silicon oxide or the like is formed. Further, in the groove TR, the trench gate electrode TG is embedded through the gate insulating film GF. The trench gate electrode TG is made of, for example, a polycrystalline silicon film into which an n-type impurity such as phosphorus is introduced. Trench gate electrode TG has a function as a gate of the unit transistor cell (gate electrode).

Further, on semiconductor substrate SB, the wiring portion TGL for gate extraction made of a conductive film of the same layer as the trench gate electrode TG is formed, the trench gate electrode TG and the wiring portion TGL for gate extraction is integrally formed and electrically connected to each other. Incidentally, the trench gate electrode TG is embedded in the groove TR, whereas the wiring portion TGL for the gate lead-out, rather than in the groove TR, and extends is disposed on the semiconductor substrate SB. Wiring portion TGL for gate drawing is electrically connected to the gate wiring EGW through a contact hole CT1 formed in the insulating film IL covering it. Gate wires EGW, the main surface of the semiconductor chip CP1, and extends along the outer periphery. The gate electrode EG is an electrode portion for forming a pad PD1$a$ for the gate of the power MOSFET. The gate electrode EG and the gate wiring EGW are integrally formed, the width of the gate electrode EG is larger than the width of the gate wiring EGW. Gate electrode EG via the wiring portion TGL for the gate wiring EGW and the gate lead-out is electrically connected to a plurality of trench gate electrodes TG formed in semiconductor substrate SB.

The source electrodes ES are electrically connected to the source $n^+$ semiconductor regions NR through contact holes CT2 formed in the insulating film IL on semiconductor substrate SB. Further, the source element ES is electronically connected to PR1 of $n^+$-type solid state region NR that is the upper portion of the p-type solid state region p+ formed between the adjacency, through which the p-type solid state region PR2 for forming channels in the main MOS region RG1. In plan view, the source electrode ES is formed over the entire area in which a plurality of unit transistor cells composing the power MOSFET is formed. Therefore, in plan view, the source electrode ES is formed on most of the main surface of the semiconductor chip CP1.

The gate electrode EG, the gate wiring EGW and the source electrode ES is formed by forming a conductor film CD so as to fill the contact hole CT1,CT2 on the insulating film IL in which the contact hole CT1,CT2 is formed, and patterning the conductor film CD. That is, the gate electrode EG, the gate wiring EGW and the source electrode ES is formed of a patterned conductor film CD. The conductor film CD is made of a metal film, preferably an aluminum film or an aluminum alloy film. Therefore, the gate electrode EG, the gate wiring EGW and the source electrode is made of the same layer of the conductor film CD, except that the gate electrode EG and the gate wiring EGW are integrally formed, are separated from each other.

The conductor film CD (gate electrode EG, gate wiring EGW and source electrode ES) is covered with an insulating protective film (insulating film, passivation film) PA. That is, on the insulating film IL, so as to cover the conductive film CD (gate electrode EG, gate wiring EGW and the source electrode ES), the protective film PA is formed. The protective film PA is a film located in the uppermost layer of the insulating film semiconductor chip CP1 has (insulating film). The protective film PA is made of an insulating film, but is preferably made of a resin film such as a polyimide resin.

A plurality of openings OP is formed in the protective film PA, and a part of the conductor film CD is exposed in each opening OP. The conductive film CD exposed from the protective film PA in the opening OP serves as a pad PD1$a$, PD1$b$. That is, each of the pad PD1$a$, PD1$b$ is formed of a conductive film CD that is exposed in the opening OP.

The pad PD1$b$ is formed of the source electrodes ES exposed from the protective film PA at an inside of the openings portion OP of the protective film PA. For this reason, the pad PD1$b$ is a pad for the source of the power MOSFET. The pad PD1$b$ is electrically connected to the source region ($n^+$ semiconductor regions NRs) of each of the plurality of unit transistor cells formed in the semiconductor substrate SB through the source electrode ES.

Here, the opening OP exposing the pads PD1$b$ is referred to as an opening OPS with the reference symbol OPS. Since the source electrode ES exposed from the protective film PA in the opening OPS of the protective film PA is a pad PD1$b$, the planar shape, the planar dimension (plane area) and the planar position of the opening OPS substantially coincides with the planar shape, the planar dimension (plane area) and the planar position of the pad PD1$b$.

A plurality of pads PD1$a$ of the semiconductor chip CP1 includes a pad PD1$a$ for the gate of the power MOSFET, and the pad PD1$a$ for the gate is formed of the gate electrode EG exposed from the protective film PA at an inside of the opening portion OP (opening portion OP provided on the gate electrode EG) of the protective film PA. The conductive film CD is covered with a protective film PA except for the pad PD1$a$, PD1$b$.

As required, the plurality of pads PD1$a$ of the semiconductor chip CP1 includes a pad for the anode of the temperature sensing diode and a pad for the cathode, and the like. The temperature sensing diode can be formed in the semiconductor substrate SB or on the semiconductor substrate. Further, the plurality of pads PD1$a$ of the semiconductor chip CP1 includes a pad for the source of the current sensing MOSFET as required. The current sensing MOSFET may be formed in the semiconductor substrate SB. Further, the plurality of pads PD1$a$ of the semiconductor chip CP1 includes a voltage-sensing kelvin pad as required. Pads for the anode and cathode of the temperature sensing diode, pads for the source of the current sensing MOSFET, and Kelvin pads are also formed by the conductor film CD exposed from the protective film PA in the opening OP of the protective film PA.

The plating layer ME is formed on the surface of each pad PD1$a$,PD1$b$ (i.e., on the conductive film CD of the portion exposed at the bottom of the opening OP). The plating layer ME is composed of, for example, a laminated film of a nickel (Ni) film, a palladium (Pd) film, and a gold (Au) film formed in order from the bottom. Alternatively, a laminated film of a nickel (Ni) film and a gold (Au) film or a silver (Ag) film can be used as the plating layer ME. The thickness of the conductor film CD may be, for example, about 3 μm to 5 μm, and the thickness of the plating layer ME may be, for example, about 5 μm to 20 μm for the nickel (Ni) film, about 0.05 μm to 0.2 μm for the palladium (Pd) film, and about 0.01 μm to 0.1 μm for the gold (Au) film when the plating film ME is a laminated film of a nickel (Ni) film, a palladium (Pd) film, and a gold (Au) film.

The plating layer ME is selectively formed on the conductor film CD exposed from the protective film PA in the opening OP of the protective film PA. Therefore, the planar shape, the planar dimension (plane area) and the planar position of the plating layer ME on the pad PD1$a$ substantially coincides with the planar shape, the planar dimension (plane area) and the planar position of the pad PD1$a$ (the opening OP exposing the pad PD1$a$). Also, the planar shape, the planar dimension (plane area) and the planar position of the plating layer ME on the pad PD1$b$ substantially coincides with the planar shape, the planar dimension (plane area) and the planar position of the pad PD1$b$ (the opening OPS exposing the pad PD1$a$).

The trench gate electrode TG of each of the plurality of unit transistor cells formed in the main MOS area RG1 is electrically connected to each other through the wiring portion TGL, the gate wiring EGW and the gate electrode EG for gate extraction. Therefore, the gate voltage is supplied from the pad PD1a for the gate to the gate (trench gate electrode TG of each of the plurality of unit transistor cells composing the power MOSFET) of the power MOSFET through the gate wiring EGW and the wiring portion TGL.

Also, the drain region of each of the plurality of unit transistor cells composing the power MOSFET is electrically connected to each other through the semiconductor substrate SB and the back electrode BE. Therefore, the drain voltage (e.g., power supply potential) is supplied from the die pad DP to the back electrode BE of the semiconductor chip CP1 through the bonding material BD1 having a conductivity. Also, the drain voltage is supplied from the back electrode BE to the drain region (drain region of each of the plurality of unit transistor cells composing the power MOSFET) of the power MOSFET.

The source regions ($n^+$ semiconductor regions NR) of the plurality of unit transistor cells composing the power MOSFET are electrically connected to the source electrode ES and are electrically connected to each other through the source electrode ES. The pad PD1b for the source of the power MOSFET is connected through wire BW3, BW4 and lead LD2, LD3 to loads external to semiconductor device PKG, etc.

In the semiconductor chip CP1 having such a configuration, the operating current of the unit transistor of the power MOSFET flows between semiconductor substrate SB for drains and $n^+$ semiconductor regions NR for sources along the side surfaces of the trench gate electrodes TG (i.e., the side surfaces of the trenches TR) along the thickness of semiconductor substrate SB. That is, channels are formed along the thickness of the semiconductor chip CP1.

Thus, the semiconductor chip CP1 is a semiconductor chip in which a vertical MOSFET having a trench-type gate structure is formed, and the power MOSFET is comprised of a trench gate type MOSFET. Here, the vertical MOSFET corresponds to a MOSFET in which the current between the source and drain flows in the thickness direction (direction substantially perpendicular to the main surface of the semiconductor substrate) of the semiconductor substrate.

<Stacked Structure of Semiconductor Chips CP1, CP2>

As described above, semiconductor device PKG of the present embodiment include a semiconductor chip CP1 and a semiconductor chip CP2 mounted on a semiconductor chip CP1. The stacked structure of the semiconductor-chip CP1, CP2 will be described with reference to FIGS. 11 to 15.

Figure 11:
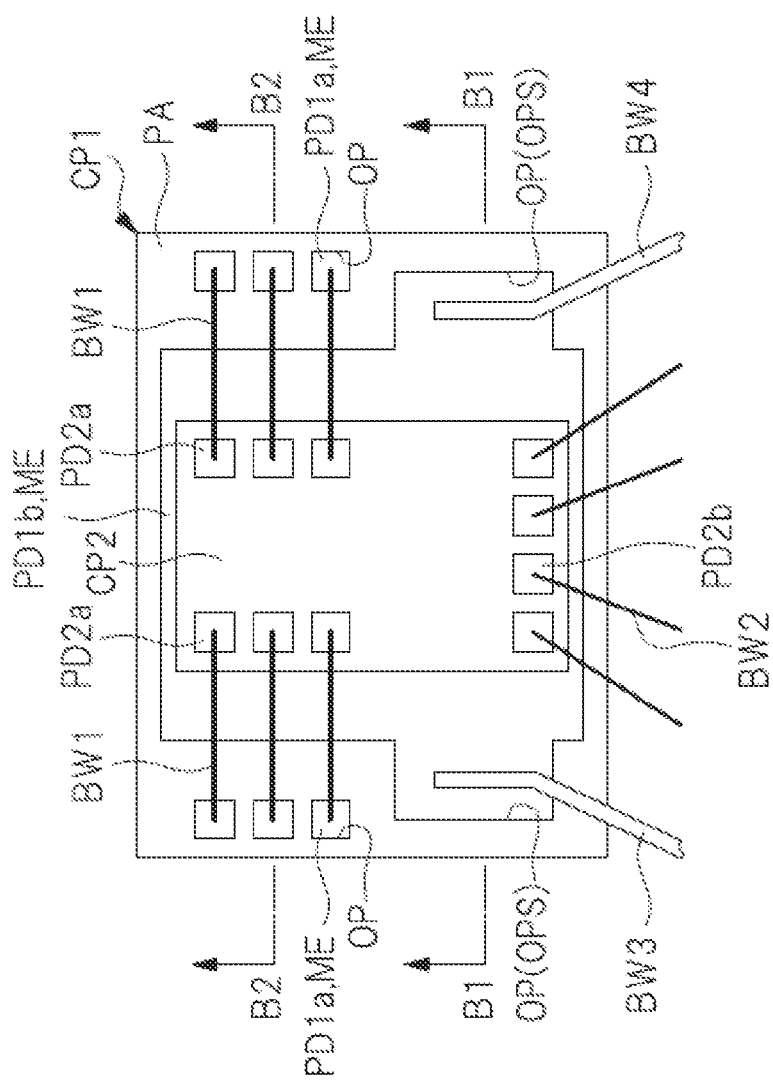
FIG. 11 is a plan view showing the two semiconductor chips in the semiconductor device according to the embodiment 1.
Figure 12:
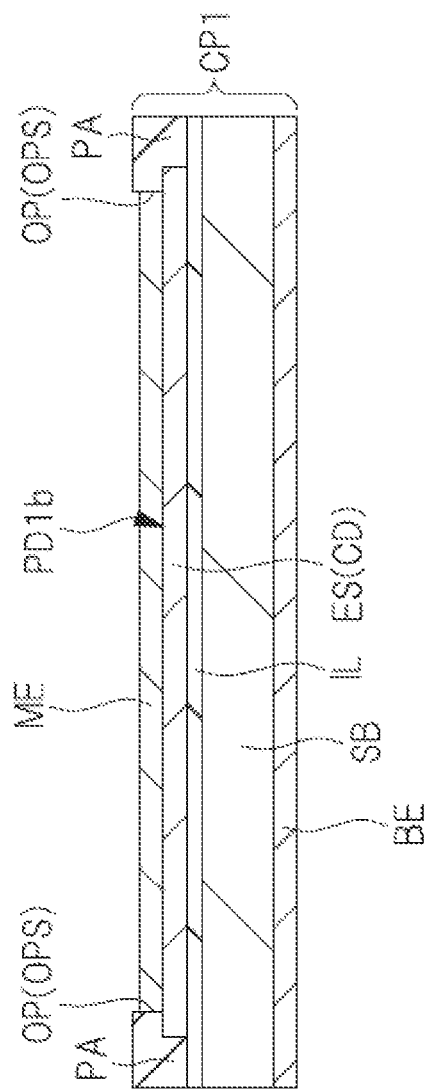
FIG. 12 is a cross-sectional view of the semiconductor chip used in the semiconductor device according to the embodiment 1.
Figure 13:
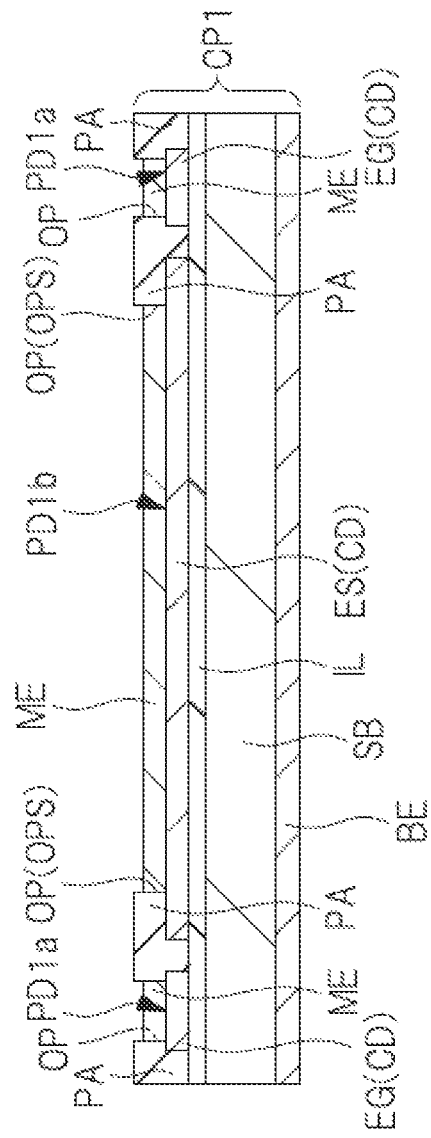
FIG. 13 is a cross-sectional view of the semiconductor chip used in the semiconductor device according to the embodiment 1.
Figure 14:
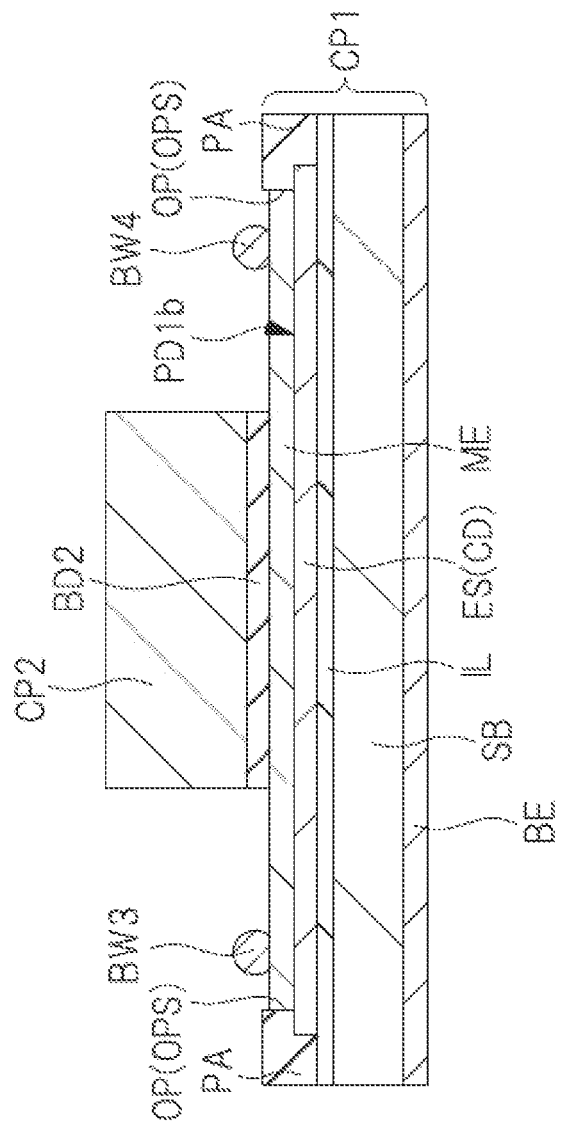
FIG. 14 is a cross-sectional view of the two semiconductor chips in the semiconductor device according to the embodiment 1.
Figure 15:
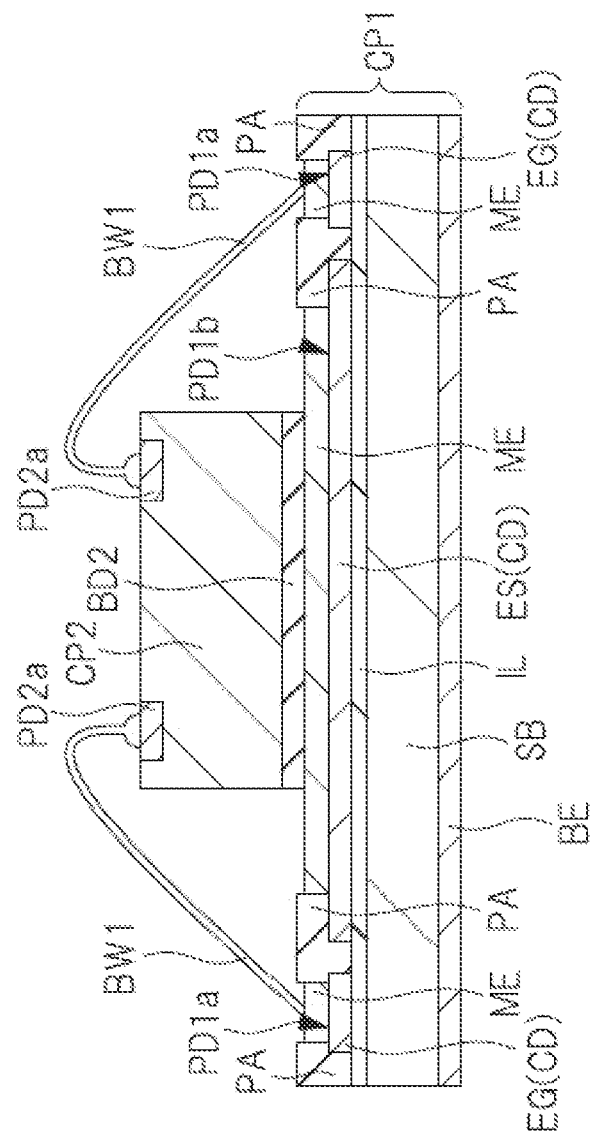
FIG. 15 is a cross-sectional view of the two semiconductor chips in the semiconductor device according to the embodiment 1.

FIG. 11 is a plan view showing a perspective view of semiconductor chips CP1, CP2 in the semiconductor device PKG. FIGS. 12 and 13 are a cross-sectional view of the semiconductor chip CP1 before mounting the semiconductor chip CP2 on the semiconductor chip CP1. FIGS. 14 and 15 are a cross-sectional view of the semiconductor chips CP1, CP2 in semiconductor device PKG. FIG. 12 corresponds to a cross-sectional view of the semiconductor chip CP1 at the position of B1-B1 line of FIG. 11, and FIG. 13 corresponds to a cross-sectional view of the semiconductor chip CP1 at the position of B2-B2 line of FIG. 11. Further, FIG. 14 corresponds to a cross-sectional view of the semiconductor chip CP1, CP2 at the position of B1-B1 line of FIG. 11, and FIG. 15 corresponds to a cross-sectional view of the semiconductor chip CP1, CP2 at the position of B2-B2 line of FIG. 11. In FIGS. 14 and 15, the die pad DP and the sealing portion MR are not shown.

As shown in FIGS. 10, 12 and 13, the plating layer ME is formed on the surfaces of the pads PD1a, PD1b of CP1. Therefore, the pad PD1a of the semiconductor chip CP1 and the pad PD2a of the semiconductor chip CP2 wire BW1 for electrically connecting is connected to the plating layer ME on the pad PD1a rather than directly connected to the pad PD1a. That is, the wire BW1 is contacting upper surface of the plating layer ME on the pad PD1a. Therefore, of both ends of each wire BW1, one end is connected to the plating layer ME on each pad PD1a of the semiconductor chip CP1, the other end is connected to each pad PD2a of the semiconductor chip CP2.

Although the semiconductor chip CP2 is mounted on the semiconductor chip CP1, specifically, the semiconductor chip CP2 on the plating layer ME on the pad PD1b of the semiconductor chip BD2 is mounted via an insulating bonding material OOE. In plan view, the semiconductor chip CP2 overlaps the pad PD1b of the semiconductor chip CP1 is contained in the pad PD1b of the semiconductor chip CP1 (refer to FIGS. 3 and 11). In another view, in plan view, the semiconductor chip CP2 is contained within the plating layer ME on the pad PD1b, and the semiconductor chip CP2 is contained within the opening OPS of the protective film PA. The planar dimension (plane area) of the semiconductor-chip CP1 is smaller than the planar dimension (plane area) of the pad PD1b (opening OPS). Since between the back surface of the plating layer ME and the semiconductor chip CP2 on the pad PD1b insulating bonding material BD2 is interposed, the back surface of the semiconductor chip CP2 is electrically insulated from the plating layer ME on the pad PD1b, therefore, it is electrically insulated from the pad CP1 (source electrode ES). Further, in plan view, the semiconductor chip CP2 is not overlapped with the pad CP1 of the semiconductor chip PD1a, therefore, the pad PD1a of the semiconductor chip CP1 is not covered by the semiconductor chip.

Further, in the present embodiment, as shown in FIGS. 5 and 6, the planar dimension of the insulating junction material BD2 (planar area) is the same as the planar dimension of the semiconductor chip CP2 (planar area), between the semiconductor chip CP2 and the plating layer ME in order to accurately prevent a short circuit, in plan view, the semiconductor chip CP2 is preferable included in the insulating bonding material BD2. In this case, the planar dimension of the insulating bonding material BD2 (planar area) is larger than the planar dimension of the semiconductor chip CP2 (planar area). Further, in plan view, it is preferable that the insulating bonding material BD2 is contained in the plating layers ME on the pads PD1b. In this case, the planar dimension of the plating layer ME on the pad PD1b (planar area) is larger than the planar dimension of the insulating bonding material BD2 (planar area).

Here, the plan view corresponds to when viewed in a plane substantially parallel to the main surface of semiconductor substrate SB composing the main surface or the semiconductor chip CP1 of the semiconductor chip CP1.

Since the plating layer ME is formed on the pad PD1b of the semiconductor chip CP1, rather than directly connected to the pad PD1b, the pad CP1 of the pad PD1b and the lead LD1 of the semiconductor chip PD1b and the wire BW3 for electrically connecting the pad PD1b and the lead LD2 of the semiconductor chip CP1 It is connected to the plating layer ME on. That is, the wire BW3 and the wire BW4 are contacting upper surface of the plating layers ME on the pad PD1b. Therefore, of both ends of the wire BW3, one end is connected to the plating layer ME on the pad PD1b of the semiconductor chip CP1, the other end is connected to the lead LD3 (inner lead portion of). Also, of both ends of the wire BW4, one end is connected to the plating layer ME on the pad PD1*b* of the semiconductor chip CP1, the other end is connected to the lead LD4 (inner lead portion of). Thus, the pad CP1 of the semiconductor chip PD1*b* and the lead LD2 is electrically connected via a wire BW3 and the plating layer ME on the pad PD1*b*, also, the pad PD1*b* and the lead LD3 of the semiconductor chip CP1 is electrically connected via a plating layer ME on the wire BW4 and the pad LD2.

In the plating layer ME on the pad PD1*b* of the semiconductor chip CP1, each of the wire BW3 and the wire BW4 is connected to the portion not covered by the semiconductor chip CP2. Specifically, in plan view, the connecting point (connecting position, connecting portion) of the wire BW3 in the plating layer ME on the pad PD1*b* and the connecting point (connecting position, connecting portion) of the wire BW4 in the plating layer ME on the pad PD1*b* are located on opposite sides to each other across the semiconductor chip CP2 therebetween. That is, in plan view, the semiconductor chip CP2 is arranged between the connecting point of the wire BW3 in the plating layer ME on the pad PD1*b* and the connecting point of the wire BW4 in the plating layer ME on the pad PD1*b*.

<Manufacturing Process of Semiconductor Device>

Examples of the manufacturing process of the semiconductor device PKG of the present embodiment will be described.

First, a lead frame having a lead LD1, LD2, LD3 and a die pad DP, and a semiconductor chip CP1, CP2. As described above, on the pad PD1*a*, PD1*b* of the semiconductor chip CP1, the plating layer ME is formed.

Next, the semiconductor chip CP1 is bonded by mounting via a bonding material BD1 on the die pad DP.

Next, mounting the semiconductor chip CP2 via an insulating bonding material BD2 on the semiconductor chip CP1. At this time, in a direction in which the back side of the semiconductor chip CP2 faces the semiconductor chip CP1, on the plating layer ME on the pad PD1*b* of semiconductor device CP1 is bonded by mounting a semiconductor chip BD2 via an insulating bonding material OOF.

Next, a wire bonding process is performed. Thus, a plurality of pads PD1*a* of the semiconductor chip CP1 and a plurality of pads PD2*a* of the semiconductor chip CP2 are electrically connected via a plurality of wires BW1, respectively, a plurality of pad PD2*b* and a plurality of leads LD3 of the semiconductor chip CP2 via a plurality of wire BW2 electrically connecting. Further, electrically connecting the pad PD1*b* and the lead LD1 of the semiconductor chip CP1 via a wire BW3, electrically connecting the pad PD1*b* and the lead LD1 of the semiconductor chip CP1 via a wire BW4.

Next, a molding process is performed to form the sealing portion MR.

Next, the lead LD1, LD2, LD3 is cut from the frame of the lead frame.

Next, the lead LD1, LD2, LD3 is bent.

In this way, semiconductor device PKG of the present embodiment can be produced.

<History of Study>

The present inventor has studied a semiconductor device equipped with a semiconductor chip for control on a semiconductor chip having a built-in power MOSFET. By mounting a semiconductor chip for control on a semiconductor chip having a built-in power MOSFET, it is possible to reduce the planar dimension of semiconductor device (plane area).

Figure 16:
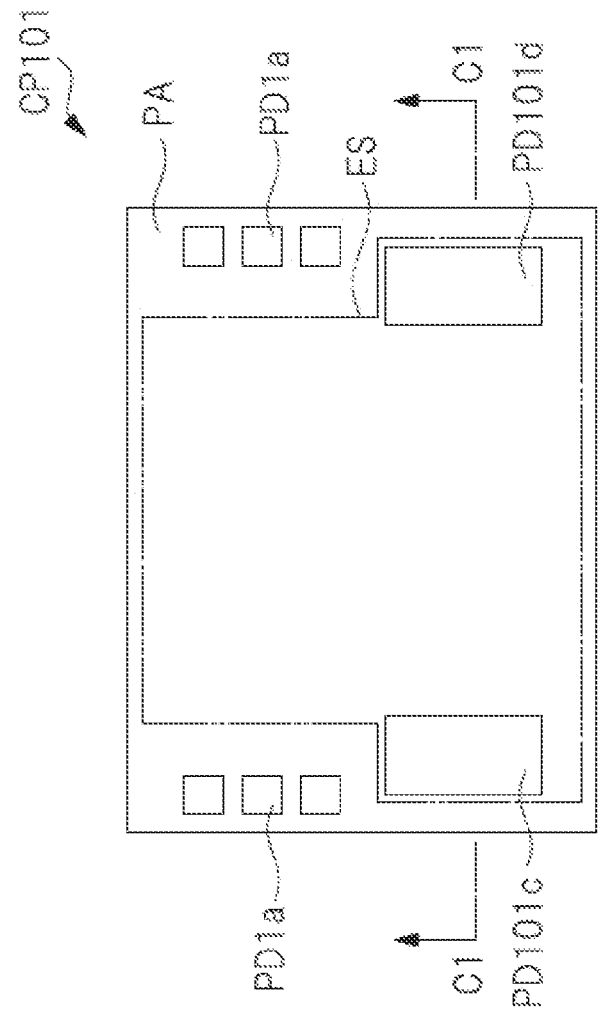
FIG. 16 is an upper surface view of a semiconductor chip used in a semiconductor device according to an examined example.
Figure 17:
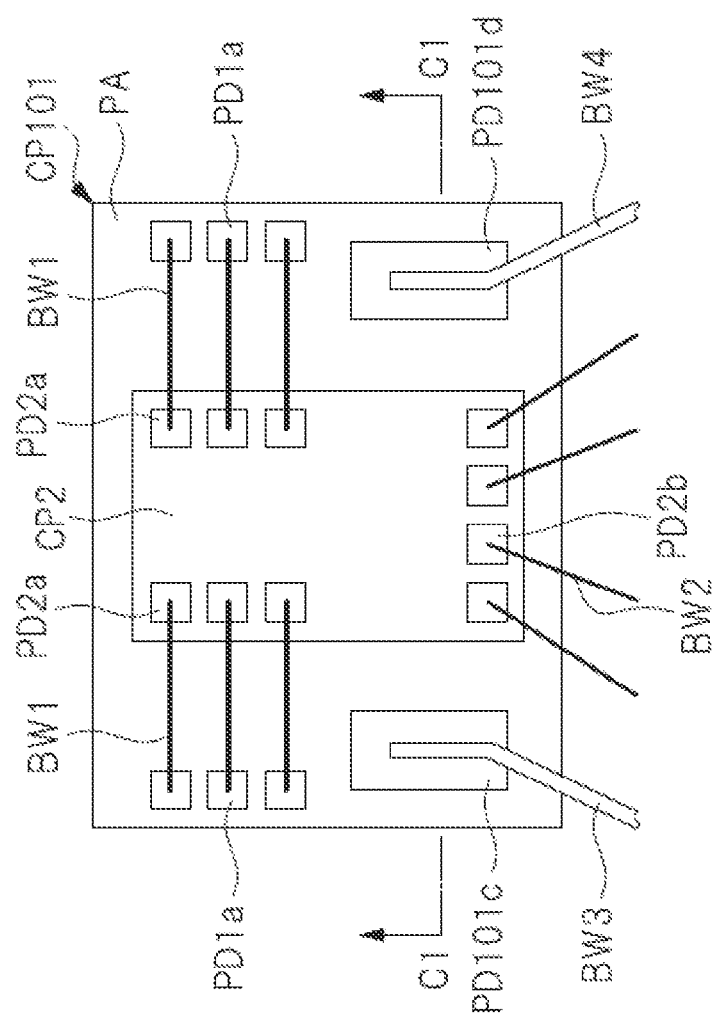
FIG. 17 is a plan view showing two semiconductor chips in the semiconductor device according to the examined example.
Figure 18:
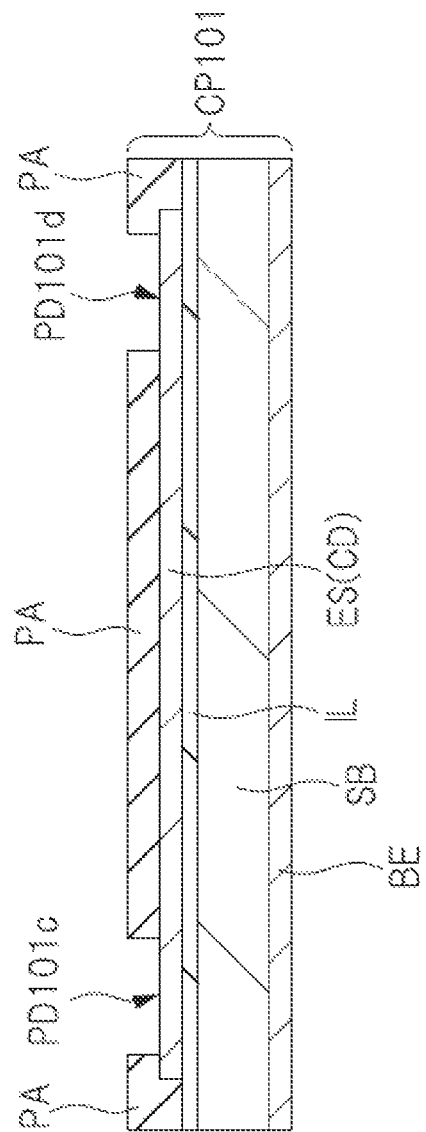
FIG. 18 is a cross-sectional view of the semiconductor chip used in the semiconductor device according to the examined example.
Figure 19:
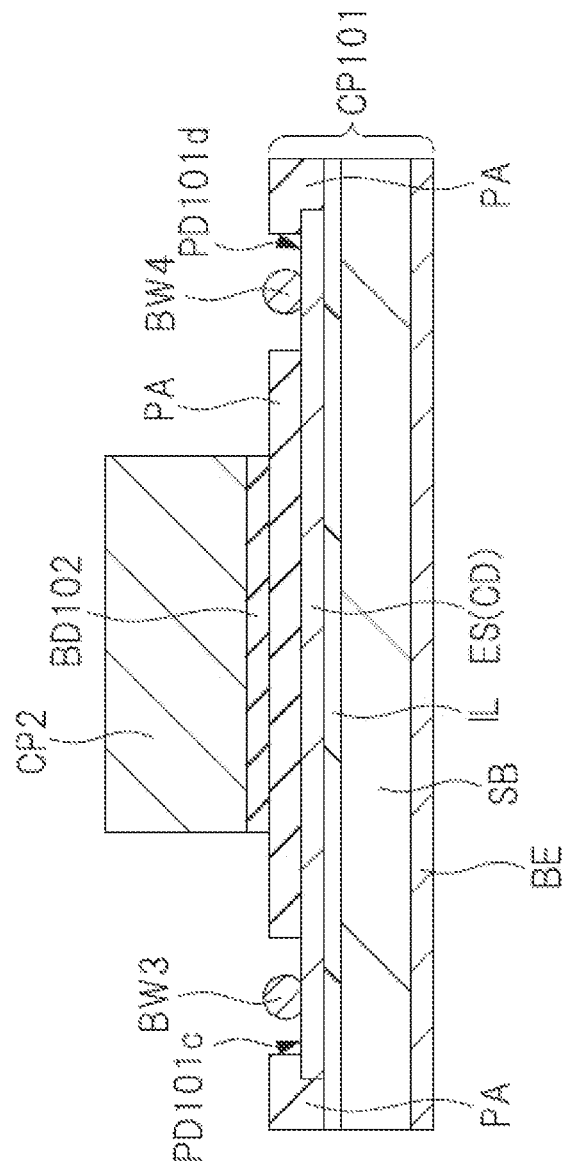
FIG. 19 is a cross-sectional view of the two semiconductor chips in the semiconductor device according to the examined example.

The examined example studied by the present inventors will be explained by referring to FIGS. 16 to 19. FIG. 16 is a upper surface diagram of a semiconductor-chip CP101 incorporating a power MOSFET and corresponds to FIG. 7 above. FIG. 17 is an plan view showing a state in which a semiconductor chip CP2 for control is mounted on the semiconductor chip CP101, which corresponds to the above FIG. 11. FIG. 18 is an cross-sectional view of the semiconductor chip CP101 at the position of C1-C1 line of FIG. 16, which corresponds to the above FIG. 12. FIG. 19 is an cross-sectional view of the semiconductor chip CP101,CP2 at the position of C1-C1 line of FIG. 17, which corresponds to the above FIG. 14. Similarly to FIG. 17, in FIG. 19, the die pad DP and the sealing portion MR are not shown.

The semiconductor chip CP101 used in examined example is equivalent to the semiconductor chip CP1, the following points are different from the semiconductor chip CP1.

That is, in the semiconductor chip CP101 of examined example, the pad PD1*b* (opening OPS) is not provided, instead, a pad PD101*d* for connecting the pad PD101*c* and the wire BW4 for connecting the wire BW3 is provided. Each of the pad PD101*c*,PD101*d* is formed of a source electrode ES exposed from the protective film PA in an opening of the protective film PA In examined example semiconductor chip CP101, the protective film PA is present in an area where the semiconductor chip CP2 is to be mounted. That is, in examined example semiconductor chip CP101, the opening of the protective film PA is not formed in the region where the semiconductor chip CP2 is to be mounted. Therefore, if examined example, when mounting the semiconductor chip CP2 on the semiconductor chip CP101, as can be seen from FIGS. 17 and 19, on the protective film PA of the semiconductor chip CP101, the semiconductor chip CP2 via an insulating bonding material BD102 will be mounted. Therefore, in examined example, the insulating bonding material BD102, the protective film PA, and the source electrode ES are provided under the semiconductor chip CP2 in this order from the top of the semiconductor chip CP2. In examined example semiconductor chip CP101, the plating layer ME is not formed on the pad PD1*a*,PD101*c*,PD101*d*. In examined example, the bonding material BD102 may be electrically conductive because the protective film PA exists below CP2 of the semiconductor chip.

According to the study by the present inventors, it has been found that the following problems arise in semiconductor device of examined example.

In each of the semiconductor chip CP1,CP101, since the plurality of unit transistor cells composing the power MOSFET is formed over a considerable area, a plurality of unit transistor cells are formed even immediately below the area where the semiconductor chip CP2 is mounted. Consequently, even immediately below the region where the semiconductor chip CP2 is mounted, so that the source electrode ES is present.

However, when the resistance of the source electrode ES is large, the potential gradient occurring in the source electrode ES is increased, the on-resistance of the power MOSFET is increased, the on-current of the power MOSFET is reduced. This can result in poor semiconductor device performance. To eliminate this, in each of the semiconductor chip CP1,CP101, it is conceivable to connect the wire to the source electrode ES at many locations. However, in each of the semiconductor chip CP1,CP101, since the region where the semiconductor chip CP2 is mounted can not connect the wire to the source electrode ES, connecting the source electrode ES and the wire at a position where the semiconductor chip CP2 is not mounted, through the source electrode ES, the source voltage to the source region of the plurality of unit transistor cells composing the power MOSFET it is required to supply.

Further, by increasing the thickness of the source electrode ES, it is also conceivable to reduce the resistance of the source electrode ES. However, if the thickness of the source electrode ES is excessively increased, in the processing step of the source electrode ES, shoulder shaving of the photoresist film used in this step may occur, resulting in a processing defect. In addition, the level difference amount of the protective film PA covering the source electrode ES formed by this processing step increases, and as a result, the risk of cracks occurring in the protective film PA increases. That is, since the outer peripheral end portion of the source electrode ES is covered with the protective film PA, a step reflecting the outer peripheral end portion of the source electrode ES is formed in the protective film PA, but when the source electrode ES is thick, the step of the protective film PA becomes large, and as a result, cracks are easily generated in the step of the protective film PA. The crack of the protective film PA is apt to occur, for example, in a wire bonding process or the like. Furthermore, if the thickness of the source electrode ES is too thick, the risk of metal in the pad is rejected to the surroundings is increased by the pad is crushed during wire bonding. This can lead to reduced reliability of semiconductor device. Therefore, reducing the on-resistance of the power MOSFET by only increasing the source-electrode ES is not a good measure.

Further, in the semiconductor chip CP101 of examined example, even when forming the plating layer ME on the pad PD101$c$,PD101$d$, the effect of reducing the on-resistance of the power MOSFET is hardly obtained. Because, in the semiconductor chip CP101, in the area where the semiconductor chip CP2 is mounted, since the protective film PA is present on the source electrode ES, the plating layer is not formed on the source electrode ES, as a result, the resistance when the current flows through the source electrode ES is hardly reduced, the effect of reducing the on-resistance of the power MOSFET is hardly obtained.

<Major Features and Effects>

The semiconductor device PKG of the present embodiment includes a die pad DP is a chip mounting portion, a semiconductor chip CP1 mounted via a bonding material BD1 on the die pad DP, and a semiconductor chip CP2 mounted on the semiconductor chip CP1.

One of the main features of the present embodiment is that the semiconductor chip CP1 has a protective film PA of the uppermost layer and a pad PD1$b$ exposed from the protective film PA in the opening OPS of the protective film PA, the semiconductor chip CP2 is mounted via an insulating bonding material BD2 on the conductive material (here, the plating layer ME) disposed on the pad PD1$b$ of the semiconductor chip CP1.

In the present embodiment, in the semiconductor chip CP1, the protective film PA does not exist in the region where the semiconductor chip CP2 is mounted. In the semiconductor chip CP1, placing the plating layer ME as a conductive material on the pad PD1$b$ exposed from the protective film PA in the opening OPS of the protective film PA (formed), the semiconductor chip CP2 via an insulating bonding material BD2 on the plating layer ME It is mounted. When a current flows through the source electrode ES of the semiconductor chip CP1, the plating layer ME on the pad PD1$b$ can also be a current path. Therefore, by placing the plating layer ME on the pad PD1$b$ exposed from the protective film PA in the opening OPS of the protective film PA, it is possible to reduce the resistance when the current flows through the source electrode ES of the semiconductor chip CP1, the source electrode ES it is possible to reduce the potential gradient caused. Thus, to reduce the on-resistance of the power MOSFET incorporated in the semiconductor chip CP1, it is possible to increase the on-current. As a result, the performance of semiconductor device PKG can be improved.

Further, in semiconductor device PKG of the present embodiment, below the semiconductor chip CP2, so that the source electrode ES of the plating layer ME and the semiconductor chip CP1 of the insulating bonding material BD2 and the semiconductor chip CP1 are arranged from above. Below the semiconductor chip CP2, although the protective film PA of the semiconductor chip CP1 is not present, electrically isolating the source electrode ES of the back surface and the semiconductor chip CP1 of the semiconductor chip can be ensured by an insulating bonding material BD2.

In the present embodiment, the protective film PA of the semiconductor chip CP1, leave the opening OPS so as to include the mounting planned area of the semiconductor chip CP2, the source electrode ES exposed in the opening OPS (i.e. pad PD1$b$) forming a plating layer ME as a conductive material. Therefore, in the semiconductor chip CP1, it is possible to form a plating layer ME on the source electrode ES even in regions overlapping the semiconductor chip CP2 in plan view. Therefore, the resistance when the current flows through the source electrode ES can be efficiently reduced, it is possible to efficiently reduce the potential gradient caused by the source electrode ES. Thus, it is possible to accurately increase the on-current of the power MOSFET incorporated in the semiconductor-chip CP1.

Further, the wire BW3 is a wire for electrically connecting the source electrode ES and the lead LD1 of the semiconductor chip CP1, the wire BW4 is a wire for electrically connecting the source electrode ES and the lead LD2 of the semiconductor chip CP1. In the present embodiment, wire BW3 and wire BW4 are connected to the plated layer MEs on the pad PD1$b$ of the semiconductor chip CP1, respectively. Therefore, each of the wire BW3, BW4, it is possible to accurately electrically connect to the source electrode ME through the plating layer ME.

Further, in the present embodiment, in plan view, the semiconductor chip CP2 is arranged between the connecting point between the wire BW3 and the plating layer ME on the pad PD1$b$ and the connecting point between the wire BW4 and the plating layer ME on the pad PD1$b$. This makes it possible to more efficiently reduce a potential gradient generated in the source electrode ES when a current flows through the source electrode ES. Therefore, it is possible to more accurately increase the on-current of the power MOSFET incorporated in the semiconductor chip CP1.

Embodiment 2

Figure 20:
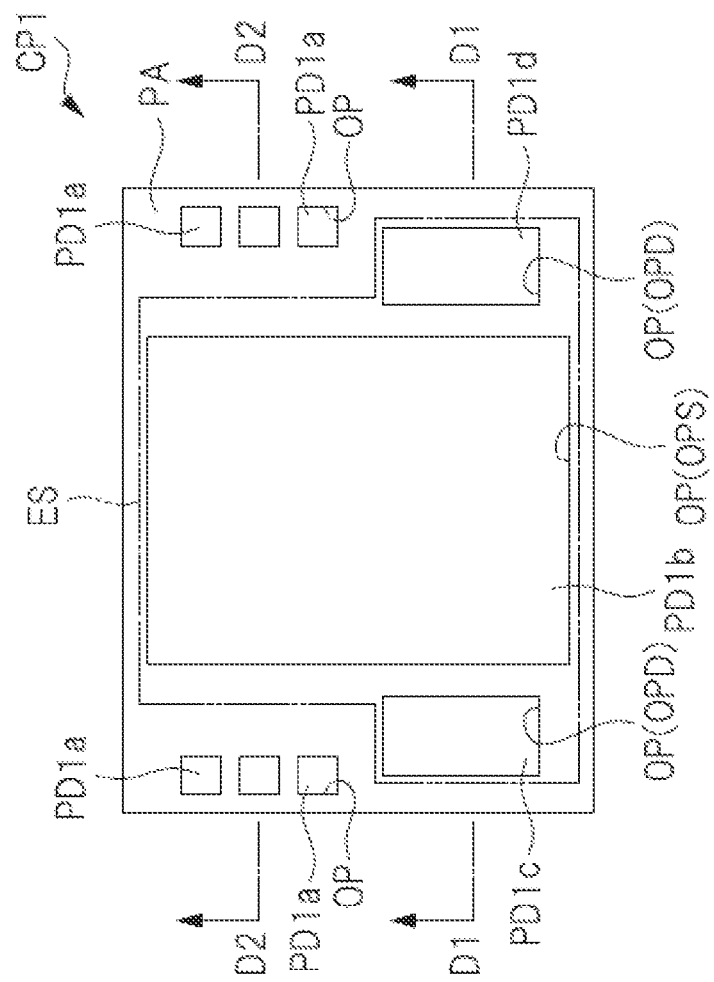
FIG. 20 is an upper surface view of a semiconductor chip used in a semiconductor device according to the embodiment 2.
Figure 21:
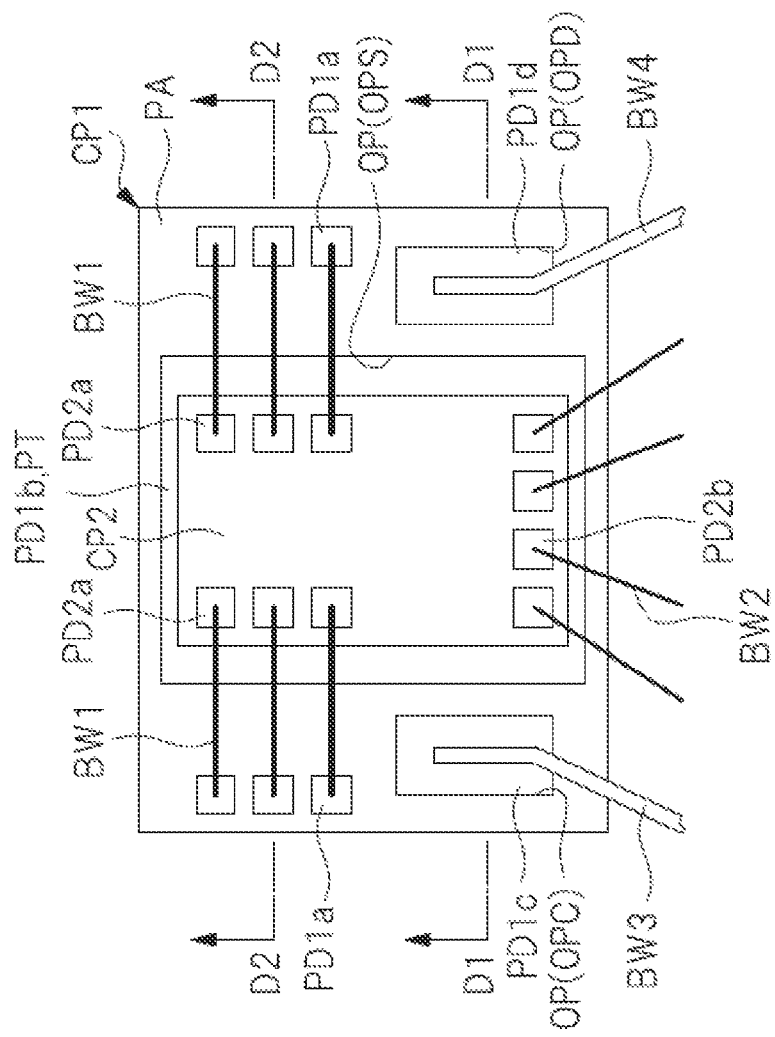
FIG. 21 is a plan view showing two semiconductor chips in the semiconductor device according to the embodiment 2.
Figure 22:
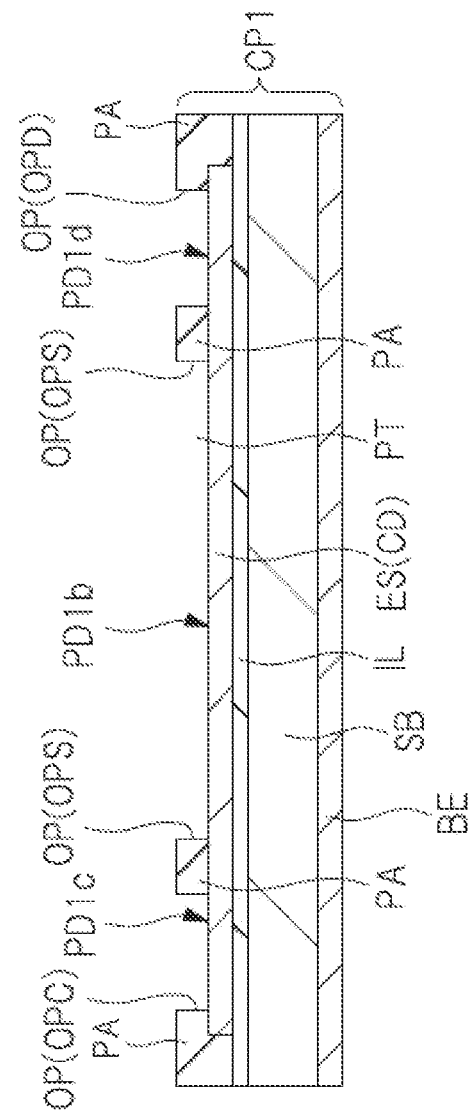
FIG. 22 is a cross-sectional view of the semiconductor chip used in the semiconductor device according to the embodiment 2.
Figure 23:
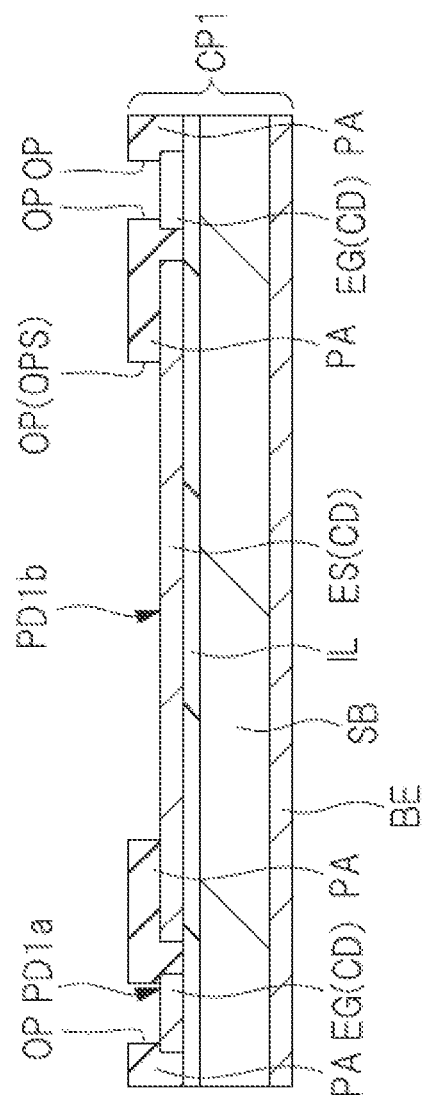
FIG. 23 is a cross-sectional view of the semiconductor chip used in the semiconductor device according to the embodiment 2.
Figure 24:
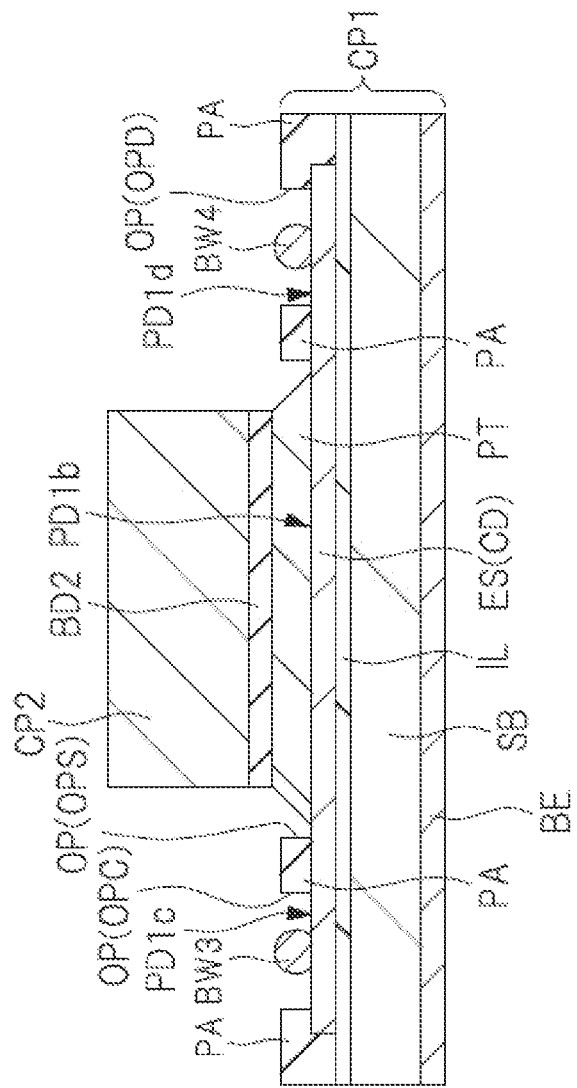
FIG. 24 is a cross-sectional view of the two semiconductor chips in the semiconductor device according to the embodiment 2.
Figure 25:
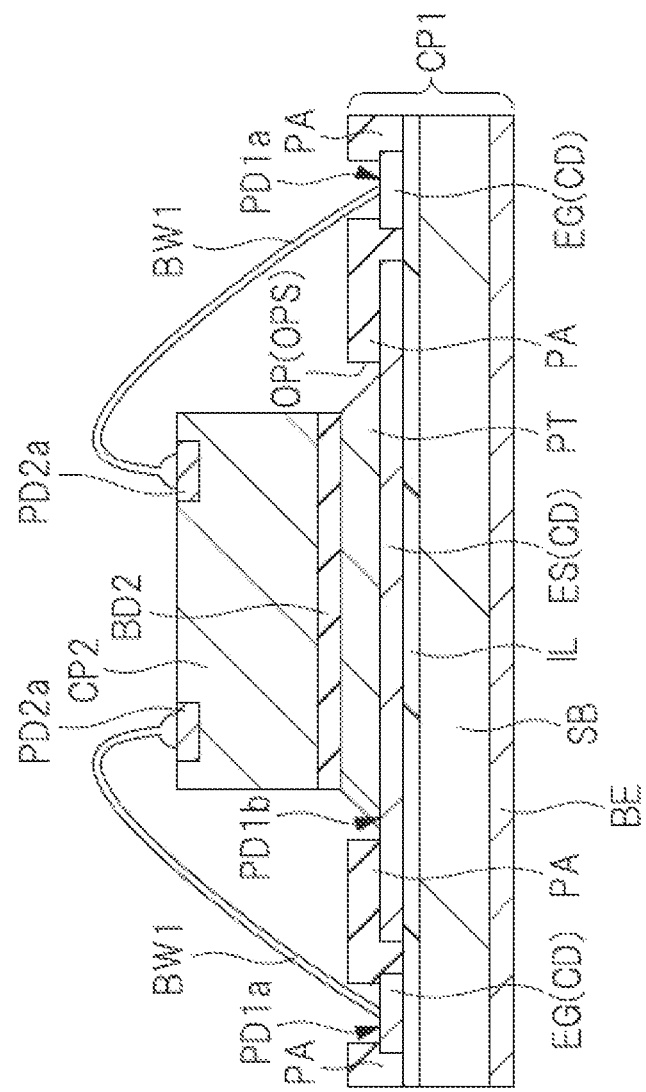
FIG. 25 is a cross-sectional view of the two semiconductor chips in the semiconductor device according to the embodiment 2.

A semiconductor device PKG according to the present embodiment 2 will be described by referring to FIGS. 20 to 25. FIG. 20 is a upper surface diagram of a semiconductor-chip CP1 used in semiconductor device PKG of the present embodiment 2, which corresponds to FIG. FIG. 21 is a plan view showing a perspective semiconductor-chip CP1,CP2 in semiconductor device PKG of the present embodiment 2, which corresponds to FIG. 11. FIGS. 22 and 23 are cross-sectional view of the semiconductor chip CP1 in the stage prior to mounting the semiconductor chip CP2 on the semiconductor chip CP1. FIG. 22 corresponds to cross-sectional view of the semiconductor chip CP1 at the position of D1-D1 line of FIG. 20, and FIG. 23 corresponds to cross-sectional view of the semiconductor chip CP1 at the position of D2-D2 line of FIG. 20. FIGS. 24 and 25 are cross-sectional view of semiconductor-chip CP1,CP2 in semiconductor device PKG of the present second embodiment. FIG. 24 corresponds to cross-sectional view of the semiconductor chip CP1,CP2 at the position of D1-D1 line of FIG. 21, and FIG. 25 corresponds to cross-sectional view of the semiconductor chip CP1,CP2 at the position of D2-D2 line of FIG. 21. In FIGS. 24 and 25, illustration of the die pad DP and the sealing portion MR is omitted.

The semiconductor chip CP1 used in semiconductor device PKG of the present embodiment 2 differs from the semiconductor chip CP1 used in semiconductor device PKG of first embodiment described above in the following points.

That is, in the semiconductor chip CP1 of the above first embodiment, the pad PD1$b$ for mounting the semiconductor chip CP2 also served as a pad for connecting the pad and the wire BW4 for connecting the wire BW3.

In contrast, in the semiconductor chip CP1 of the present second embodiment, a pad PD1$b$ for mounting the semiconductor chip CP2, and a pad PD1$d$ for connecting the pad PD1$c$ and the wire BW4 for connecting the wire BW3, are provided separately. Each of the pad PD1$b$,PD1$c$,PD1$d$ is formed by a source electrode ES exposed from the protective film PA in the opening OP of the protective film PA Therefore, the pads PD1$b$,PD1$c$,PD1$d$ are electrically connected to each other through the source electrodes.

Here, the opening OP exposing the pad PD1$b$ is denoted by OPS as the opening OPS, the opening OP exposing the pad PD1$c$ is denoted by OPC as the opening OPC, and the opening OP exposing the pad PD1$d$ is denoted by OPD as the opening OPD. The source electrode ES exposed from the protective film PA in the opening OPS of the protective film PA is a pad PD1$b$, the source electrode ES exposed from the protective film PA in the opening OPC of the protective film PA is a pad PD1$c$, and the source electrode ES exposed from the protective film PA in the opening OPD of the protective film PA is a pad PD1$d$ The planar shape, the planar dimensions (planar area) and the planar position of the opening OPSs are approximately coincident with the planar shape, the planar dimensions and the planar positions of the pad PD1$b$. The planar shapes, planar dimensions and planar positions of the aperture OPCs are approximately coincident with the planar shapes, planar dimensions and planar positions of the pad PD1$c$. The planar shape, the planar dimension and the planar position of the opening OPD are approximately coincident with the planar shape, the planar dimension and the planar position of the pad PD1$d$.

In the semiconductor chip CP1 of the present embodiment 2, the openings OPS,OPC,OPD of the protective film PA are not connected to each other and are separated from each other. Therefore, in a plan view, a protective film PA is present between the openings OPS,OPC,OPD of the protective film PA (and thus between the padding PD1$b$,PD101$c$, PD101$d$) The connection of the opening OPS, the opening OPC, and the opening OPD of the protective film PA in the semiconductor chip CP1 of the present second embodiment substantially corresponds to the opening OPS of the protective film PA in the semiconductor chip CP1 of the above first embodiment. In the semiconductor chip CP1 of the present second embodiment, since the opening OPS is disposed between the opening OPC and the opening OPD in plan view, the pad PD1$b$ is disposed between the pad PD1$c$ and the pad PD1$d$.

Further, in the semiconductor chip CP1 of the present second embodiment, the plating layer ME on the pad PD1$a$, PD1$b$,PD1$c$,PD1$d$ is not formed.

Otherwise, the semiconductor chip CP1 used in semiconductor device PKG of the present embodiment 2 is also the same as the semiconductor chip CP1 used in semiconductor device PKG of first embodiment, and therefore, its repetitive explanation is omitted here.

The semiconductor device PKG of the present embodiment 2 differs from semiconductor device PKG of first embodiment in the following points.

For semiconductor device PKG of the above first embodiment, the plating layer ME is disposed (formed) as a conductive material on the pad PD1$b$ of the semiconductor chip CP1, the semiconductor chip CP2 via an insulating bonding material BD2 on the plating layer ME It is mounted. In contrast, in semiconductor device PKG of the present second embodiment, as shown in FIGS. 24 and 25, a conductive paste material (a hardened conductive paste material) PT is disposed (formed) as a conductive material on the pad PD1$b$ of the semiconductor chip CP1, the conductive paste material PT semiconductor chip CP2 is mounted on the conductive paste material PT via an insulating bonding material BD2. The conductive paste material PT is preferably made of a silver paste (one in which a silver paste is cured) The cured conductive paste material PT may be a sintered body of a plurality of metal particles, for example, silver particles.

The conductive paste material PT on the pad PD1$b$ is electrically connected to the source electrode ES. The back surface of the semiconductor chip PD1$b$ is electrically insulated from the conductive paste material PT on the pad CP2 because an insulating bonding material BD2 is interposed between the conductive paste material PT on the pad PD1$b$ and the back surface of the semiconductor chip CP1, and thus is electrically insulated from the pad (source electrode ES) of the semiconductor chip. The thickness of the conductive paste material PT may be, for example, about 3 μm to 50 μm.

In the above first embodiment, the wires BW3,BW4 are connected to the plating layers ME on the pad electrodes PD1$b$. More specifically, the wires BW3,BW4 are connected to the plating layers MEs formed on the surfaces of the pads PD1$b$, i.e., the surfaces exposed from the protective film PAs at the bottoms of the openings OPs. On the other hand, in the present second embodiment, each wire BW3,BW4 is connected to each of the pads PD1$c$,PD1$d$. More specifically, each wire BW3,BW4 is connected to the surface of each pad PD1$b$,PD1$d$, i.e., the surface of the pad exposed from the protective film PA at the bottom of the opening OP. That is, in the present embodiment 2, one end of both ends of the wire BW3 is connected to the pad PD1$c$ of the semiconductor chip CP1, the other end is connected to the lead LD3 (inner lead portion of). Also, of both ends of the wire BW4, one end is connected to the pad PD1$d$ of the semiconductor chip CP1, the other end is connected to the lead LD4 (inner lead portion of). Thus, the source electrode ES and the lead LD1 is electrically connected via a wire BW3, also the source electrode ES and the lead LD2 is electrically connected via a wire BW4.

In the manufacturing process of semiconductor device PKG of the present embodiment 2, after mounting the semiconductor chip CP1 through the bonding material BD1 on the die pad DP, prior to mounting the semiconductor chip CP2 on the semiconductor chip CP1, the pad PD1b of the semiconductor chip CP1 applying a conductive paste material PT such as silver paste. In the coating step, the conductive paste material PT is not cured. After the conductive paste material PT such as silver paste is cured, the semiconductor chip CP2 is mounted on the cured conductive paste material PT via the insulating bonding material BD2.

Therefore, in the present second embodiment semiconductor device PKG, below the semiconductor chip CP2, so that the insulating bonding material BD2 and the source electrode ES of the conductive paste material PT and the semiconductor chip CP1 are arranged in order from above.

In the semiconductor device PKG of the present embodiment 2, in plan view, the semiconductor chip CP2 is contained within the pad PD1b of the semiconductor chip CP1 and thus within the opening OPS of the protective film PA of the semiconductor chip CP1. In plan view, it is preferable that the semiconductor chip CP2 is contained in the conductive paste material PT disposed on the pads PD1b.

Otherwise, the semiconductor device PKG of the present embodiment 2 is also the same as semiconductor device PKG of first embodiment, and therefore, its repeated explanation is omitted here.

Also in this second embodiment, in the semiconductor chip CP1, the protective film PA does not exist in the region where the semiconductor chip CP2 is mounted. In the semiconductor chip CP1, by placing the conductive paste material PT as a conductive material on the pad PD1b exposed from the protective film PA in the opening OPS of the protective film PA, on the conductive paste material PT and mounting the semiconductor chip CP2 via an insulating bonding material BD2. When a current flows through the source electrode ES of the semiconductor chip CP1, the conductive paste material PT on the pad PD1b can also be a current path. Therefore, by placing the conductive paste material PT on the pad PD1b exposed from the protective film PA in the opening OPS of the protective film PA, it is possible to reduce the resistance when the current flows through the source electrode ES of the semiconductor chip CP1, the source electrode ES it is possible to reduce the potential gradient caused. Thus, to reduce the on-resistance of the power MOSFET incorporated in the semiconductor chip CP1, it is possible to increase the on-current. As a result, the performance of semiconductor device PKG can be improved.

In the present embodiment, a pad PB1b is disposed between the pad PD1c and the pad electrodes PD1d in plan view. This makes it possible to more efficiently reduce a potential gradient generated in the source electrode ES when a current flows through the source electrode ES. Therefore, it is possible to more accurately increase the on-current of the power MOSFET incorporated in the semiconductor-chip CP1.

In each of the present embodiment 2 and third embodiment to be described later, a soldering material may be used instead of the conductive paste material PT as modified example.

Embodiment 3

Figure 26:
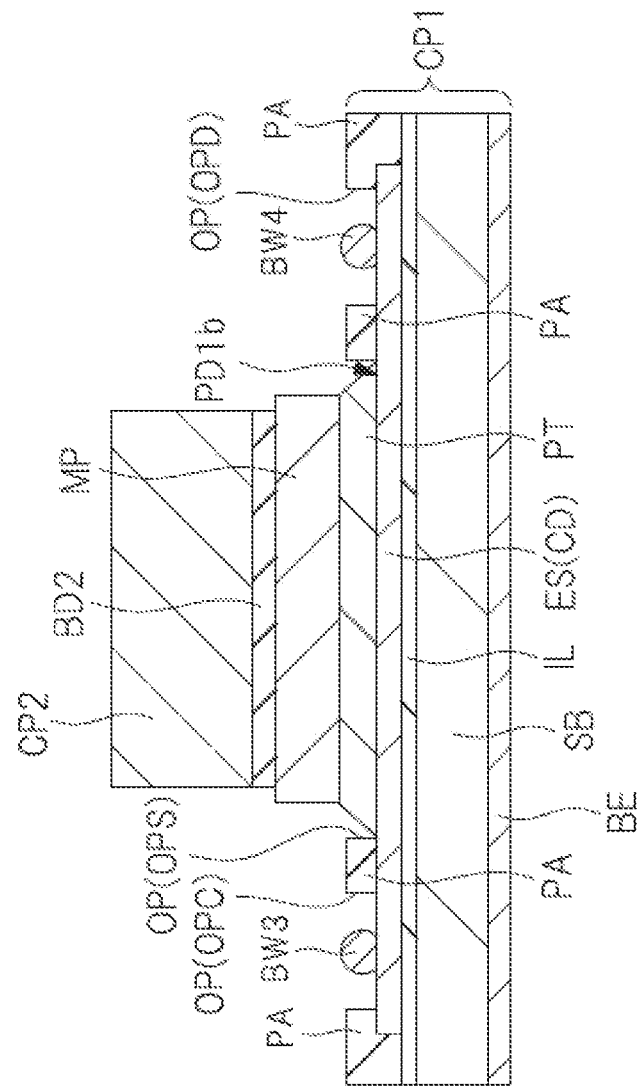
FIG. 26 is a cross-sectional view of two semiconductor chips in a semiconductor device according to the embodiment 3.
Figure 27:
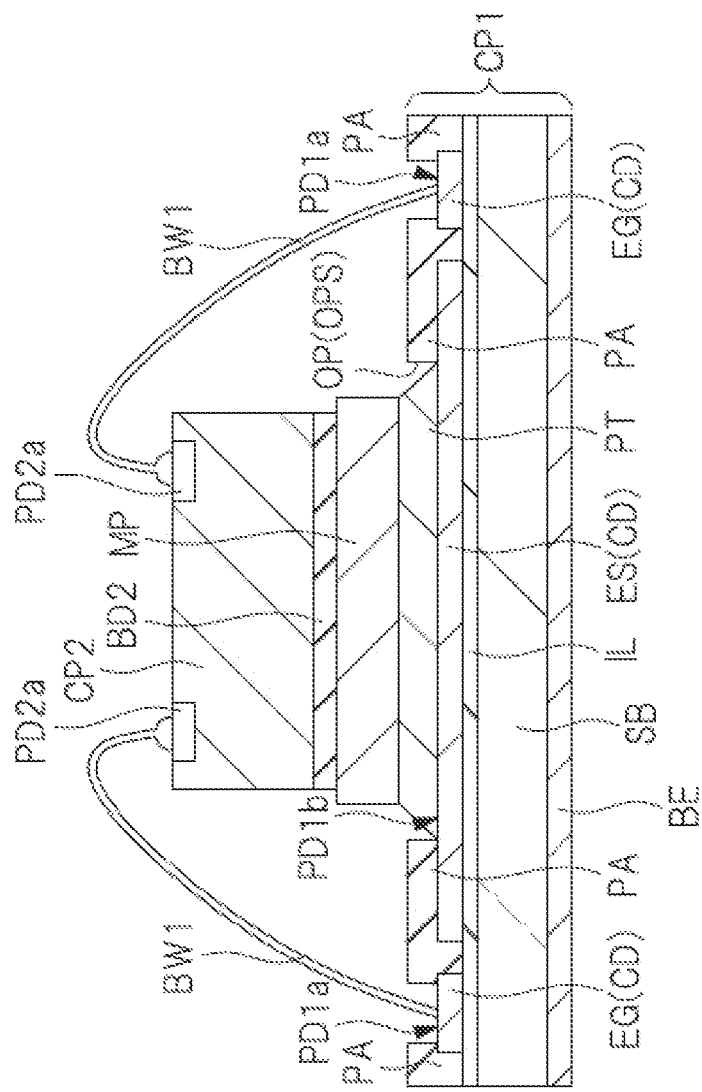
FIG. 27 is a cross-sectional view of the two semiconductor chips in the semiconductor device according to the embodiment 3.

The semiconductor device PKG according to the present embodiment 3 will be described by referring to FIGS. 26 and 27. FIGS. 26 and 27 are a cross-sectional view of the semiconductor chip CP1, CP2 in the semiconductor device PKG of the present third embodiment. FIG. 26 corresponds to FIG. 24 above, and thus corresponds to cross-sectional view of the semiconductor chip CP1,CP2 at the position of D2-D2 line of FIG. 21 above. FIG. 27 corresponds to FIG. 25, and therefore corresponds to cross-sectional view of CP1,CP2 at the position of D2-D2 line in FIG. 21. As in FIGS. 24 and 25, the die pad DP and the sealing portion MR are not shown in FIGS. 26 and 27. Incidentally, upper surface diagram and cross-sectional view of the semiconductor-chip CP1 used in semiconductor device PKG of the present embodiment 3, since the same as in FIG. 20, FIG. 22 and FIG. 23, the repeated illustration is omitted here. Plan view of semiconductor device PKG of the present third embodiment shown in a perspective view of the semiconductor chip CP1,CP2 is the same as that of FIG. 21, and therefore, the repetitive illustration thereof is omitted here.

The semiconductor chip CP1 used in semiconductor device PKG of the present embodiment 3 is the same as the semiconductor chip CP1 used in semiconductor device PKG of second embodiment.

The semiconductor device PKG of the present embodiment 3 differs from semiconductor device PKG of second embodiment in the following points.

In semiconductor device PKG of the present embodiment 3, as shown in FIGS. 26 and 27, On the pad PD1b of the semiconductor chip CP1, a conductive paste material PT and a metal plate (metal thin film) MP on the conductive paste material PT as a conductive material is disposed (formed), the semiconductor chip CP2 via an insulating bonding material BD2 on the metal plate MP It is mounted. The metal plate MP is made of, for example, a copper plate (copper thin film), but a metal other than copper may be used. The conductive paste material PT on the pad PD1b is electrically connected to the source electrode ES, and the metal plate MP on the conductive paste material PT is electrically connected to the conductive paste material PT. Therefore, the metal plate MP is electrically connected to the source electrode ES through the conductive paste material PT. Since between the back surface of the metal plate MP and the semiconductor chip CP2 insulating bonding material BD2 is interposed, the back surface of the semiconductor chip CP2 is electrically insulated from the metal plate MP, therefore, the pad PD1b of the semiconductor chip CP1 (source electrode ES) and electrically insulated. The thickness of the conductive paste material PT may be, for example, about 3 μm to 50 μm, and the thickness of the metal plate MP may be, for example, about 100 μm to 250 μm.

In the manufacturing process of semiconductor device PKG of the present embodiment 3, after mounting the semiconductor chip CP1 through the bonding material BD1 on the die pad DP, prior to mounting the semiconductor chip CP2 on the semiconductor chip CP1, the conductive paste material PT such as silver paste on the pad PD1b of the semiconductor chip CP1 (not cured in the coating step) is applied. Then, the metal plate MP is disposed on the conductive paste material PT, and the conductive paste material PT is cured. Thereafter, mounting the semiconductor chip CP2 via an insulating bonding material BD2 on the metal plate MP. This also applies to fourth embodiment described later.

Therefore, in semiconductor device PKG of the present third embodiment, below the semiconductor chip CP2, so that the insulating bonding material BD2 and the metal plate MP and the conductive paste material PT and the source electrode ES of the semiconductor chip CP1 are arranged in order from above.

In semiconductor device PKG of the present embodiment 3, in plan view, the semiconductor chip CP2 is contained within the pad PD1b of the semiconductor chip CP1 and thus within the opening OPS of the protective film PA of the semiconductor chip CP1. In plan view, it is preferable that the semiconductor chip CP2 is contained in the conductive paste material PT disposed on the pads PD1b. In plan view, it is preferable that the semiconductor chip CP2 is included in the metal plate MP.

Otherwise, semiconductor device PKG of the present embodiment 3 is also the same as semiconductor device PKG of second embodiment, and therefore, its repeated explanation is omitted here.

Also in the present third embodiment, in the semiconductor chip CP1, the region for mounting the semiconductor chip CP2, the protective film PA is not present. In the semiconductor chip CP1, by placing the conductive paste material PT and the upper metal plate MP as a conductive material on the pad PD1b exposed from the protective film PA in the opening OPS of the protective film PA, the semiconductor chip CP2 via an insulating bonding material BD2 on the metal plate MP It is mounted. When current flows through the source electrode ES of the semiconductor chip CP1, the conductive paste material PT on the pad PD1b and the metal plate MP thereon can also be a current path. Therefore, it is possible to reduce the resistance when the current flows through the source electrode ES of the semiconductor chip CP1, it is possible to reduce the potential gradient caused by the source electrode ES. Thus, to reduce the on-resistance of the power MOSFET incorporated in the semiconductor chip CP1, it is possible to increase the on-current. As a result, the performance of semiconductor device PKG can be improved.

Embodiment 4

Figure 28:
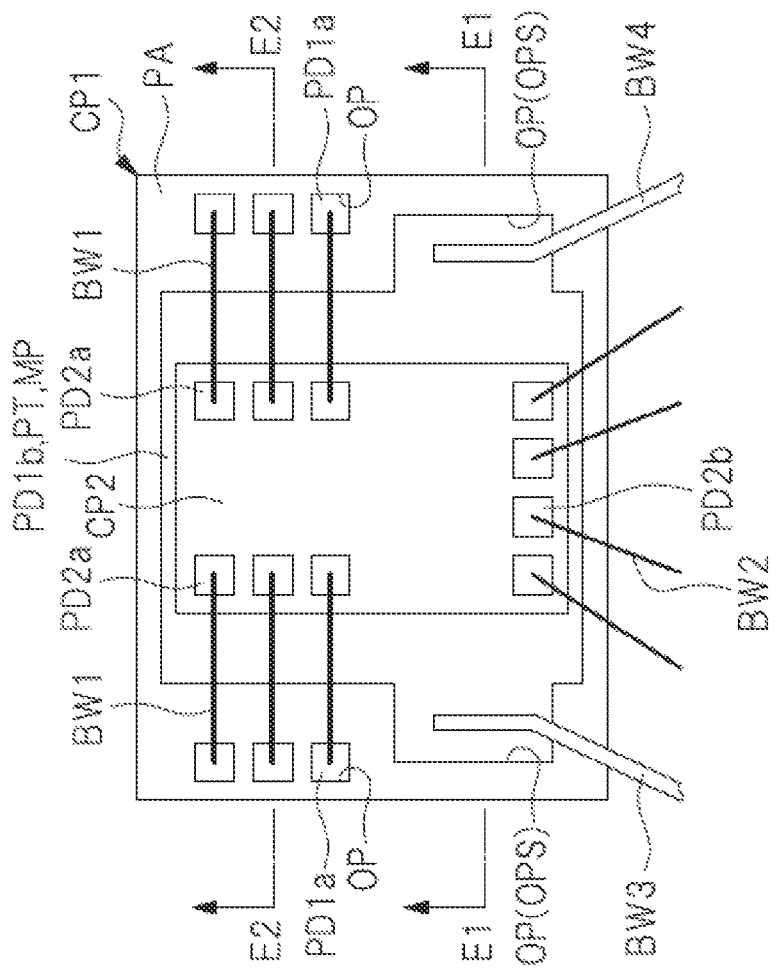
FIG. 28 is a plan view showing two semiconductor chips in a semiconductor device according to the embodiment 4.
Figure 29:
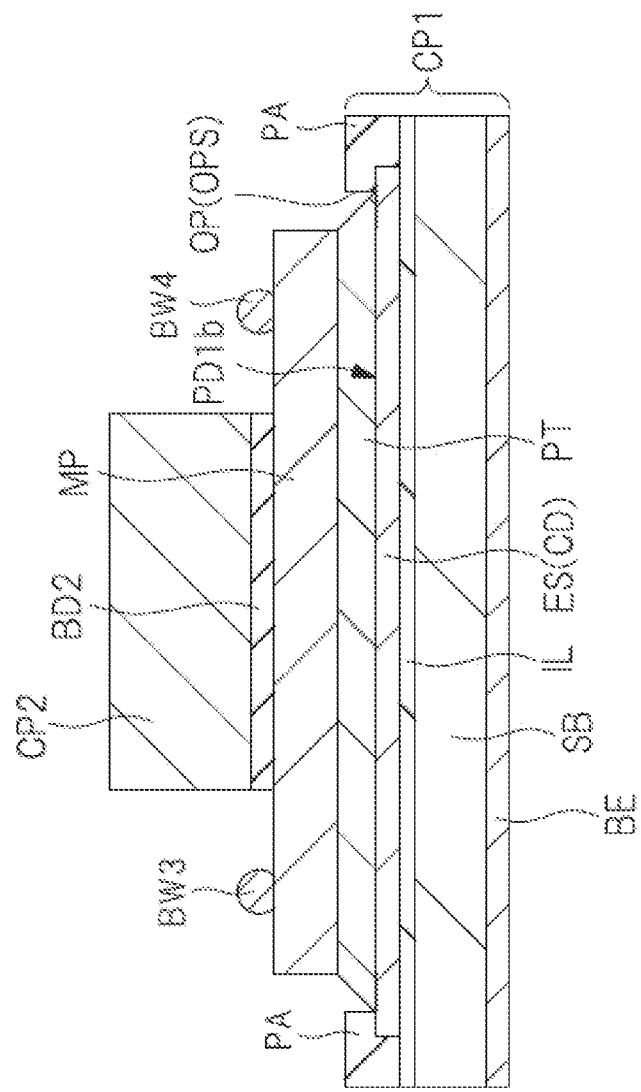
FIG. 29 is a cross-sectional view of the two semiconductor chips in the semiconductor device according to the embodiment 4.
Figure 30:
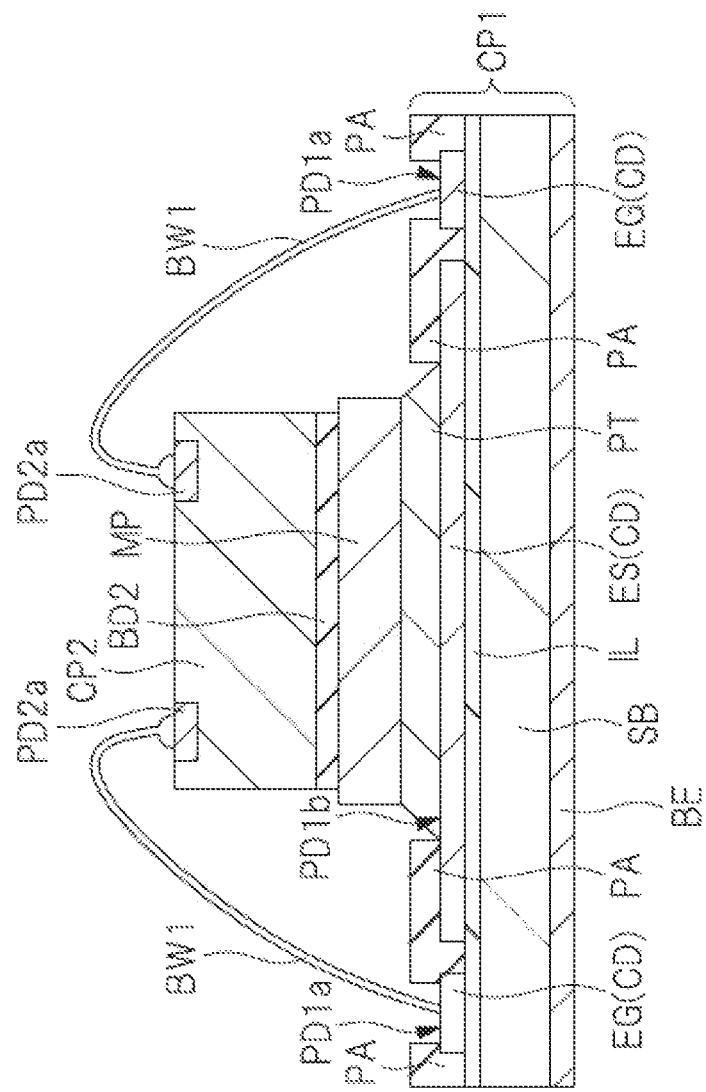
FIG. 30 is a cross-sectional view of the two semiconductor chips in the semiconductor device according to the embodiment 4.

The semiconductor device PKG of the present embodiment 4 will be described by referring to FIGS. 28 to 30. FIG. 28 is a plan view showing perspective semiconductor-chip CP1,CP2 in semiconductor device PKG of the present embodiment 4, which corresponds to FIGS. 11 and 21 above. FIGS. 29 and 30 are cross-sectional view of semiconductor-chip CP1,CP2 in semiconductor device PKG of the present fourth embodiment. FIG. 29 corresponds to cross-sectional view of the semiconductor chip CP1,CP2 at the position of E1-E12 line of FIG. 28, and FIG. 30 corresponds to cross-sectional view of the semiconductor chip CP1,CP2 at the location of E2-E2 line of FIG. 28. In FIGS. 29 and 30, the die pad DP and the sealing portion MR are not shown.

The semiconductor chip CP1 used in semiconductor device PKG of the present embodiment 4 differs from the semiconductor chip CP1 used in semiconductor device PKG of first embodiment described above in the following points. That is, in the semiconductor chip CP1 of the present fourth embodiment, the plating layer ME on the pad PD1a,PD1b is not formed. Otherwise, the semiconductor chip CP1 used in semiconductor device PKG of the present embodiment 4 is also the same as the semiconductor chip CP1 used in semiconductor device PKG of first embodiment, and therefore, its repeated explanation is omitted here.

Similarly to the above third embodiment, in semiconductor device PKG of the present fourth embodiment, as shown in FIGS. 29 and 30, the conductive paste material PT and the metal plate (metal thin film) MP on the conductive paste material PT as the conductive material are arranged (formed) on the pad PD1b of the semiconductor chip CP1, and the semiconductor chip CP2 is mounted on the metal plate MP through the insulating bonding material BD2. Therefore, similarly to the above third embodiment, even in semiconductor device PKG of the present fourth embodiment, below the semiconductor chip CP2, so that the insulating bonding material BD2 and the metal plate MP and the conductive paste material PT and the source electrode ES of the semiconductor chip CP1 are arranged in order from above.

In this fourth embodiment, the semiconductor chip CP1 does not have an opening OPC,OPD and pad PD1c,PD1d, and the planar dimensions (planar area) of the opening OPS and pad PD1b are larger than the planar dimensions (planar area) of the opening OPS and pad PD1b in the above third embodiment. Therefore, in the present fourth embodiment, the planar dimensions of the conductive paste material PT and the metal plate MP is larger than that of the above third embodiment.

Also, in semiconductor device PKG of the present embodiment 4, in plan view, the semiconductor chip CP2 is contained in the pad PD1b of the semiconductor chip CP1, and thus the opening OPS of the protective film PA of the semiconductor chip CP1. In plan view, it is preferable that the semiconductor chip CP2 is contained in the conductive paste material PT disposed on the pads PD1b. In plan view, it is preferable that the semiconductor chip CP2 is included in the metal plate MP.

In the above third embodiment, the wire BW3 is connected to the pad PD1b and the wire BW4 is connected to the pad PD1c, but in the present fourth embodiment, the wire BW3,BW4 is connected to the metallic plate MP. That is, in the present embodiment 4, one end of both end portions of the wire BW3 is connected to the metallic plate MP, and the other end is connected to the inner lead portion of the lead LD3. Also, of both ends of the wire BW4, one end is connected to the metal plate MP, the other end is connected to the lead LD4 (inner lead portion of). Thus, the source electrode ES and the lead LD1 is electrically connected via a wire BW3, a metal plate MP and the conductive paste material PT, also the source electrode ES and the lead LD2 is electrically connected via a wire BW4, a metal plate MP and the conductive paste material PT.

Otherwise, semiconductor device PKG of the present embodiment 4 is also the same as semiconductor device PKG of third embodiment, and therefore, its repeated explanation is omitted here.

Also in the present fourth embodiment, in the semiconductor chip CP1, by placing the conductive paste material PT and the upper metal plate MP as a conductive material on the pad PD1b exposed from the opening OPS of the protective film PA, on the metal plate MP a semiconductor chip CP2 via an insulating bonding material BD2. When current flows through the source electrode ES of the semiconductor chip CP1, the conductive paste material PT on the pad PD1b and the metal plate MP thereon can also be a current path. Therefore, it is possible to reduce the resistance when the current flows through the source electrode ES of the semiconductor chip CP1, it is possible to reduce the potential gradient caused by the source electrode ES. Thus, to reduce the on-resistance of the power MOSFET incorporated in the semiconductor chip CP1, it is possible to increase the on-current. As a result, the performance of semiconductor device PKG can be improved.

In the present embodiment 4, the planar dimensions of the conductive paste material PT and the metal plate MP can be made larger than those of third embodiment. Therefore, in the present embodiment 4, it is possible to further reduce the resistance when the current flows through the source electrode ES, and it is possible to further reduce the potential gradient generated in the source electrode ES, as compared with the above-mentioned third embodiment. Therefore, to further reduce the on-resistance of the power MOSFET incorporated in the semiconductor chip CP1, it is possible to further increase the on-current.

Further, in the present fourth embodiment, in plan view, the semiconductor chip CP2 is arranged between the connecting point between the wire BW3 and the metal plate MP and the connecting point between the wire BW4 and the metal plate MP. This makes it possible to more efficiently reduce a potential gradient generated in the source electrode ES when a current flows through the source electrode ES. Therefore, it is possible to more accurately increase the on-current of the power MOSFET incorporated in the semiconductor-chip CP1.

Embodiment 5

Figure 31:
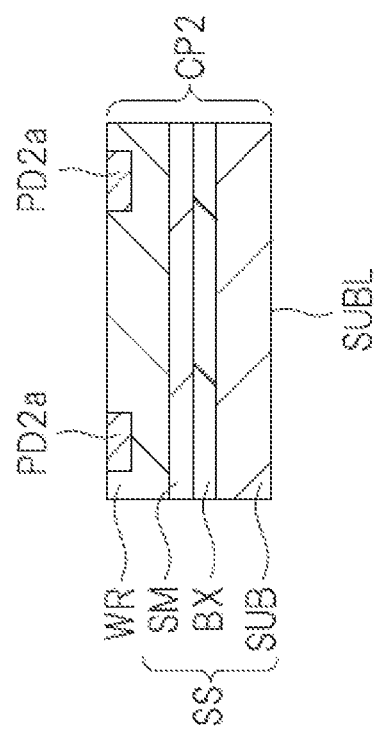
FIG. 31 is a cross-sectional view of a semiconductor chip used in a semiconductor device according to the embodiment 5.
Figure 32:
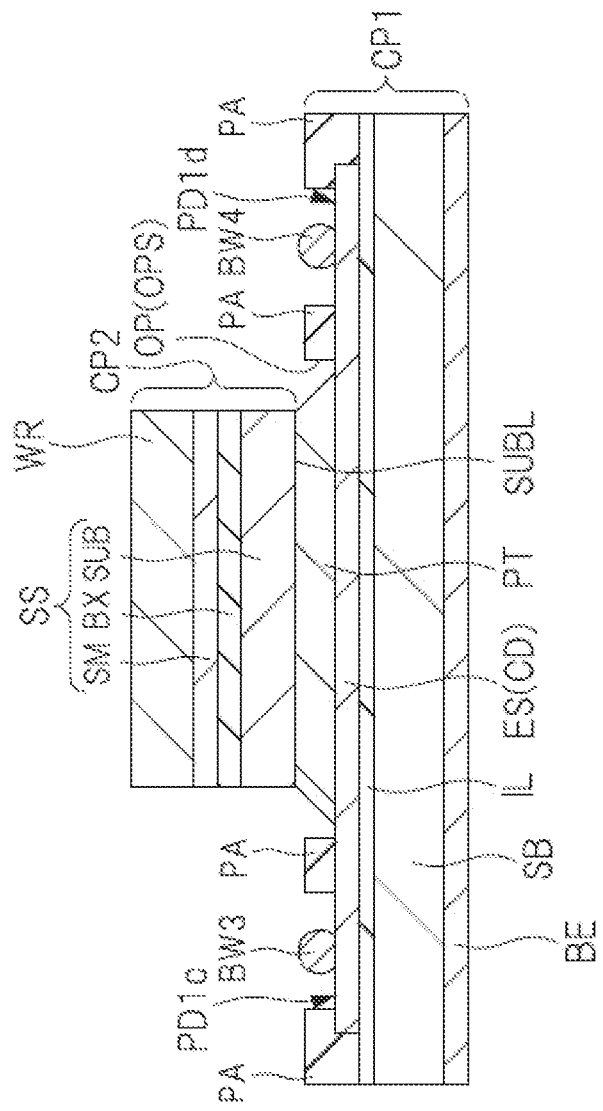
FIG. 32 is a cross-sectional view of two semiconductor chips in the semiconductor device according to the embodiment 5.
Figure 33:
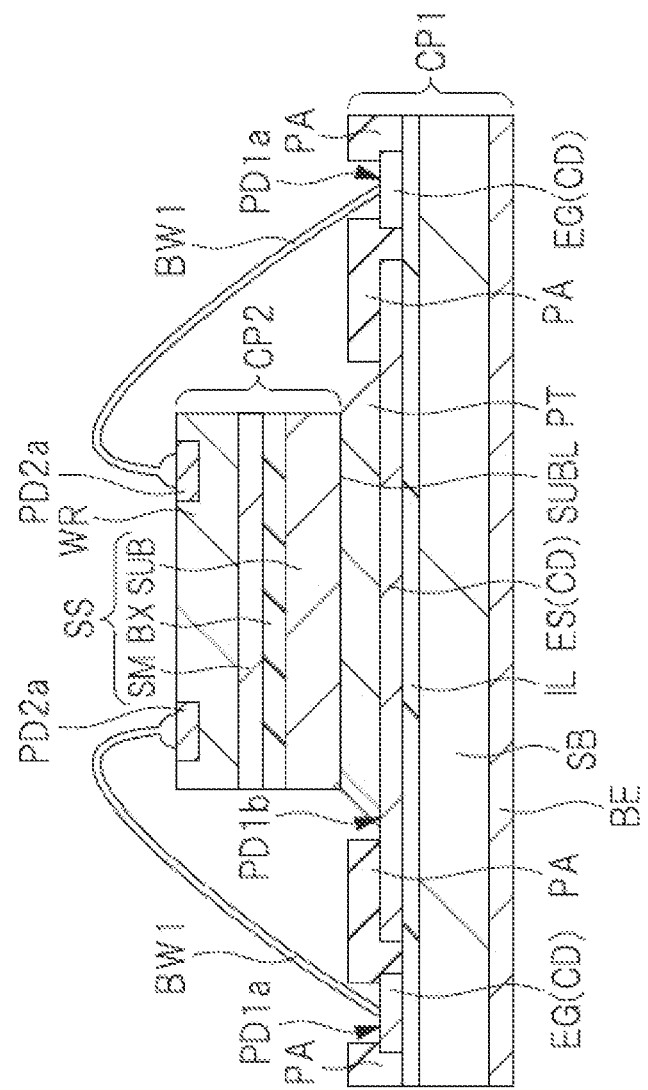
FIG. 33 is a cross-sectional view of the two semiconductor chips in the semiconductor device according to the embodiment 5.

A semiconductor device PKG of the present embodiment 5 will be described by referring to FIGS. 31 to 33. FIG. 31 is a cross-sectional view of a semiconductor-chip CP2 used in semiconductor device PKG of the present fifth embodiment. FIGS. 32 and 33 are cross-sectional view of semiconductor-chip CP1, CP2 in semiconductor device PKG of the present fifth embodiment. FIG. 32 corresponds to FIG. 24 above, and thus corresponds to cross-sectional view of the semiconductor chip CP1, CP2 at the position of D2-D2 line of FIG. 21 above. FIG. 33 corresponds to FIG. 25, and therefore corresponds to cross-sectional view of CP1, CP2 at the position of D2-D2 line in FIG. 21. As in FIGS. 24 and 25, the die pad DP and the sealing portion MR are not shown in FIGS. 32 and 33. Incidentally, upper surface diagram and cross-sectional view of the semiconductor-chip CP1 used in semiconductor device PKG of the present embodiment 5, since the same as in FIG. 20, FIG. 22 and FIG. 23, the illustration of repetition is omitted here. Plan view of semiconductor device PKG of the present fifth embodiment shown in a perspective view of the semiconductor chip CP1,CP2 is the same as that of FIG. 21, and therefore, the repetitive illustration thereof is omitted here.

As shown in FIG. 31, the semiconductor chip CP2 used in semiconductor device PKG of the present embodiment 5 is a semiconductor chip manufactured using SOI (Silicon On Insulator) substrate. That is, the semiconductor chip CP2 of the present embodiment 5 includes an semiconductor substrate (support substrate) SUB, an insulating layer (BOX layer) BX on semiconductor substrate SUB (more specifically, upper surface of semiconductor substrate SUB), and a SOI substrate SS having a semiconductor layer SM on the insulating layer BX, and a multilayer wiring structure WR formed on SOI substrate SS. Multilayer wiring structure includes a plurality of interlayer insulating films and a plurality of wiring layers. The pad PD2a, PD2b is formed in the multilayer interconnect structure WR. The semiconductor elements composing the control circuit for controlling the semiconductor chip CP1 is formed in the semiconductor layer SM of the SOI substrate SS.

As shown in FIGS. 32 and 33, in the semiconductor device PKG of the present fifth embodiment, the semiconductor chip CP2 is mounted on the pad electrode PD1b of the semiconductor chip CP1 via the conductive material (here, conductive paste material PT) such that the lower surface (back surface) SUBL of the semiconductor substrate SUB faces the semiconductor chip CP1. The conductive material interposed between the semiconductor chip CP2 and the pad electrode semiconductor substrate SUB and the semiconductor chip CP1 of the pad electrode PD1b (source electrode ES) composing the semiconductor chip PD1b (here conductive paste material PT) is electrically connected via.

In the above second embodiment, an insulating bonding material BD2 was interposed between the semiconductor chip CP2 and the conductive paste material PT. In the present fifth embodiment, the insulator is not interposed between the semiconductor chip CP2 and the conductive paste material PT, semiconductor substrate SUB composing the semiconductor chip CP2 is electrically connected to the conductive paste material PT, the conductive paste material PT It is electrically connected to the pad electrode PD1b of the semiconductor chip CP1 through the (source electrode ES).

In the manufacturing process of semiconductor device PKG of the present embodiment 5, after mounting the semiconductor chip CP1 through the bonding material BD1 on the die pad DP, prior to mounting the semiconductor chip CP2 on the semiconductor chip CP1, the conductive paste material PT such as silver paste on the pad PD1b of the semiconductor chip CP1 (not cured in the coating step) is applied. Then, the semiconductor chip CP2 is mounted on the die pad DP via the conductive paste material PT, and the conductive paste material PT is cured.

Otherwise, semiconductor device PKG of the present embodiment 5 is also the same as semiconductor device PKG of second embodiment, and therefore, its repeated explanation is omitted here.

In the present fifth embodiment, the semiconductor chip CP2 is mounted through the conductive paste material PT as a conductive material on the pad PD1b exposed from the protective film PA in the opening OPS of the protective film PA of the semiconductor chip CP1. Then, semiconductor substrate SUBs of SOI substrate SS composing the semiconductor chip CP2 is electrically connected to the pad PD1b of the semiconductor chip CP1 via the conductive paste material PT. Therefore, when the current flows through the source electrode ES of the semiconductor chip CP1, the conductive paste material PT on the pad PD1b and semiconductor substrate SUBs thereon can also be a current path. Therefore, it is possible to reduce the resistance when the current flows through the source electrode ES of the semiconductor chip CP1, it is possible to reduce the potential gradient caused by the source electrode ES. Thus, to reduce the on-resistance of the power MOSFET incorporated in the semiconductor chip CP1, it is possible to increase the on-current. As a result, the performance of semiconductor device PKG can be improved.

Further, the semiconductor device including the semiconductor chip CP2 is formed in the semiconductor layer SM rather than semiconductor substrate SUB. Semiconductor elements formed in the semiconductor layer SM and the semiconductor layer SM is electrically insulated from semiconductor substrate SUB by the insulating layer BX. Therefore, by the insulating layer BX is interposed between the semiconductor layer SM and semiconductor substrate SUB, the semiconductor element formed in the semiconductor layer SM and the semiconductor layer SM is electrically insulated from semiconductor substrate SUB, the conductive paste material PT and the pad PD1b (source electrode ES).

Further, in order to efficiently reduce the resistance when the current flows through the source electrode ES of the semiconductor chip CP1, as semiconductor substrate SUBs, it is preferable to use an n-type or p-type semiconductor substrate having a high impurity concentration. The impurity concentrations of semiconductor substrate SUBs can be, for example, about $1 \times 10^{19}/cm^3 \sim 1 \times 10^{21}/cm^3$.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
   a chip mounting portion;
   a first semiconductor chip mounted on the chip mounting portion via a first bonding material; and
   a second semiconductor chip mounted on the first semiconductor chip,
   wherein the first semiconductor chip has:
      a first semiconductor substrate;
      a MOSFET formed in the first semiconductor substrate;
      a first pad electrode formed of a source electrode electrically connected with a source of the MOSFET; and
      a protective film formed so as to expose a part of the first pad electrode inside of a first opening portion of the protective film, and
   wherein the second semiconductor chip is mounted on a conductive material, which is arranged on the first pad electrode of the first semiconductor chip, via a second bonding material of an insulative property.

2. The semiconductor device according to claim 1,
   wherein the first semiconductor chip has a drain electrode formed on a back surface of the first semiconductor chip and electrically connected with a drain of the MOSFET,
   wherein the first semiconductor chip is mounted on the chip mounting portion via the first bonding material such that the drain electrode of the first semiconductor chip faces the chip mounting portion,
   wherein the first bonding material has a conductivity, and
   wherein the drain electrode of the first semiconductor chip is electrically connected with the chip mounting portion via the first bonding material.

3. The semiconductor device according to claim 2, wherein the MOSFET is comprised of a plurality of unit transistor cells formed in the first semiconductor substrate and coupled with each other in parallel.

4. The semiconductor device according to claim 1, wherein the conductive material is comprised of a plating layer.

5. The semiconductor device according to claim 1, wherein the conductive material is comprised of a conductive paste material.

6. The semiconductor device according to claim 1, wherein the conductive material is comprised of a conductive paste material and a metal plate arranged on the conductive paste material.

7. The semiconductor device according to claim 1, wherein the conductive material is comprised of a solder material.

8. The semiconductor device according to claim 1, further comprising:
   a first lead;
   a second lead;
   a first wire electrically connected the source electrode with the first lead; and
   a second wire electrically connected the source electrode with the second lead.

9. The semiconductor device according to claim 8,
   wherein the first semiconductor chip has:
      a second pad electrode exposed from the protective film at an inside of a second opening portion of the protective film;
      a third pad electrode exposed from the protective film at an inside of a third opening portion of the protective film,
   wherein the second pad electrode is formed of the source electrode exposed from the protective film at the second opening portion of the protective film,
   wherein the third pad electrode is formed of the source electrode exposed from the protective film at the third opening portion of the protective film,
   wherein the first wire is electrically connected with the second pad electrode, and
   wherein the second wire is electrically connected with the third pad electrode.

10. The semiconductor device according to claim 9, wherein, in plan view, the first pad electrode is arranged between the second pad electrode and the third pad electrode.

11. The semiconductor device according to claim 8,
    wherein the first semiconductor chip has a plurality of fourth pad electrodes,
    wherein the second semiconductor chip has a plurality of fifth pad electrodes, and
    wherein the plurality of fourth pad electrodes of the first semiconductor chip is electrically connected with the plurality of fifth pad electrodes of the second semiconductor chip via a plurality of third wires, respectively.

12. The semiconductor device according to claim 8, wherein each of the first wire and the second wire is connected to the conductive material on the first pad electrode.

13. The semiconductor device according to claim 12, wherein, in plan view, the second semiconductor chip is arranged between a connecting point between the first wire and the conductive material and a connecting point between the second wire and the conductive material.

14. The semiconductor device according to claim 1, further comprising:
    a sealing portion sealing the chip mounting portion, the first semiconductor chip and the second semiconductor chip.

15. The semiconductor device according to claim 1, wherein the second semiconductor chip is a semiconductor chip for controlling the first semiconductor chip.

16. The semiconductor device according to claim 1,
    wherein the second semiconductor chip has an SOI substrate including:
       a second semiconductor substrate;
       an insulating layer on the second semiconductor substrate; and
       a semiconductor layer on the insulating layer,
    wherein the second semiconductor chip is mounted on the first pad electrode of the first semiconductor chip via a conductive material such that a lower surface of the second semiconductor substrate faces the first semiconductor chip, and
    wherein the second semiconductor substrate is electrically connected with the first pad electrode via the conductive material.

* * * * *